(12) United States Patent
Kim et al.

(10) Patent No.: US 9,831,172 B2
(45) Date of Patent: Nov. 28, 2017

(54) SEMICONDUCTOR DEVICES HAVING EXPANDED RECESS FOR BIT LINE CONTACT

(71) Applicant: Samsung Electronics Co., Ltd.

(72) Inventors: Daeik Kim, Hwaseong-si (KR); Jemin Park, Suwon-si (KR); Sunghee Han, Hwaseong-si (KR); Yoosang Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/971,402

(22) Filed: Dec. 16, 2015

(65) Prior Publication Data

US 2016/0181198 A1 Jun. 23, 2016

(30) Foreign Application Priority Data

Dec. 17, 2014 (KR) ........................ 10-2014-0182320

(51) Int. Cl.
  *H01L 21/02* (2006.01)
  *H01L 23/522* (2006.01)
  *H01L 27/108* (2006.01)

(52) U.S. Cl.
  CPC ...... *H01L 23/5223* (2013.01); *H01L 23/5226* (2013.01); *H01L 27/10814* (2013.01); *H01L 27/10817* (2013.01); *H01L 27/10855* (2013.01); *H01L 27/10897* (2013.01); *H01L 2924/0002* (2013.01)

(58) Field of Classification Search
  CPC ............. H01L 23/5223; H01L 23/5226; H01L 27/10814; H01L 27/10817; H01L 27/10855; H01L 27/10897; H01L 27/10885; H01L 27/10888
  See application file for complete search history.

(56) References Cited

U.S. PATENT DOCUMENTS

| | | |
|---|---|---|
| 5,801,412 A | 9/1998 | Tobita |
| 2003/0094634 A1* | 5/2003 | Cho ..................... H01L 23/585 257/212 |
| 2014/0203357 A1 | 7/2014 | Kim et al. |
| 2015/0056801 A1* | 2/2015 | Park .................. H01L 21/76814 438/655 |
| 2015/0126013 A1* | 5/2015 | Hwang ............ H01L 27/10888 438/381 |
| 2015/0255466 A1* | 9/2015 | Hwang ............ H01L 21/02164 438/586 |

FOREIGN PATENT DOCUMENTS

| | | |
|---|---|---|
| KR | 10-2012-0076913 A | 7/2012 |
| KR | 10-2014-0091845 A | 7/2014 |

* cited by examiner

*Primary Examiner* — Allen Parker
*Assistant Examiner* — Frederick B Hargrove
(74) *Attorney, Agent, or Firm* — Myers Bigel, P.A.

(57) ABSTRACT

A semiconductor device includes a first device isolation region and a second device isolation region defining a first active region, a second active region, and a third active region in a substrate, a recess region exposing an upper surface of the first active region and upper surfaces of the first and second device isolation regions, and active buffer patterns on the second and third active regions. The first active region is located between the second and third active regions, the first device isolation region is located between the first and second active regions, the second device isolation region is located between the first and third active regions. Upper sidewalls of the second and third active regions are exposed in the recess region.

17 Claims, 44 Drawing Sheets

FIG. 16
FIG. 17
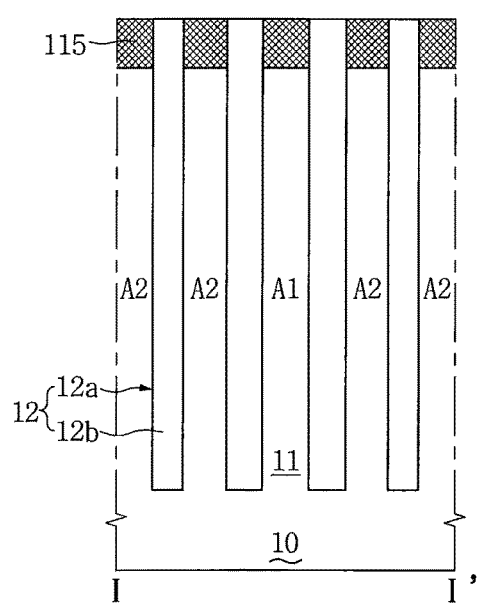
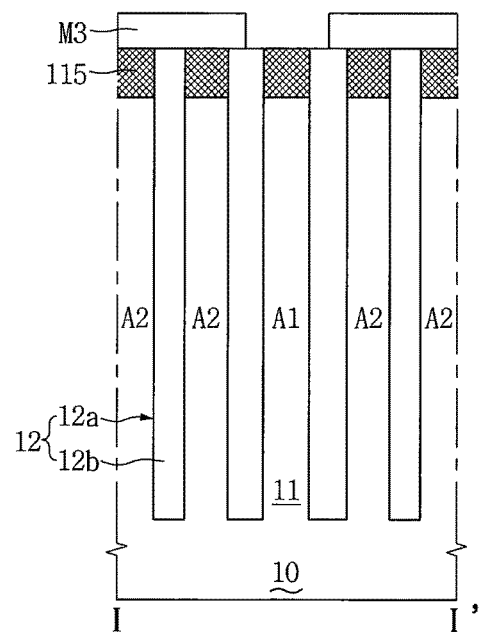

FIG. 18
FIG. 19
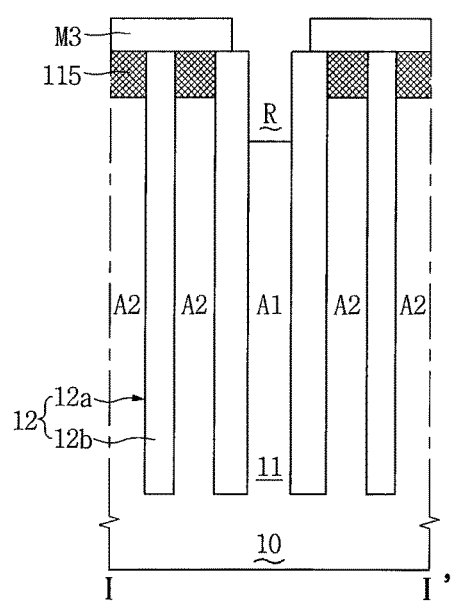
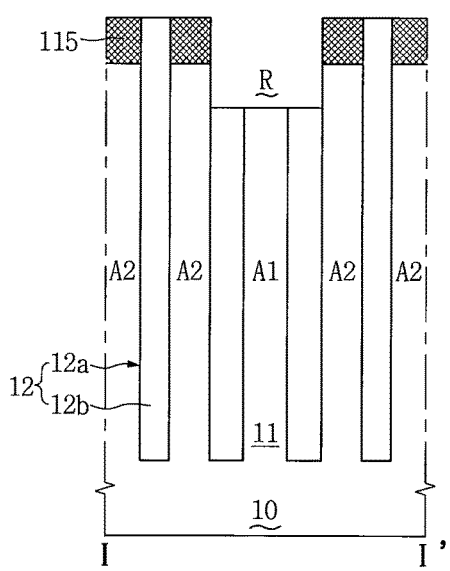

FIG. 20
FIG. 21
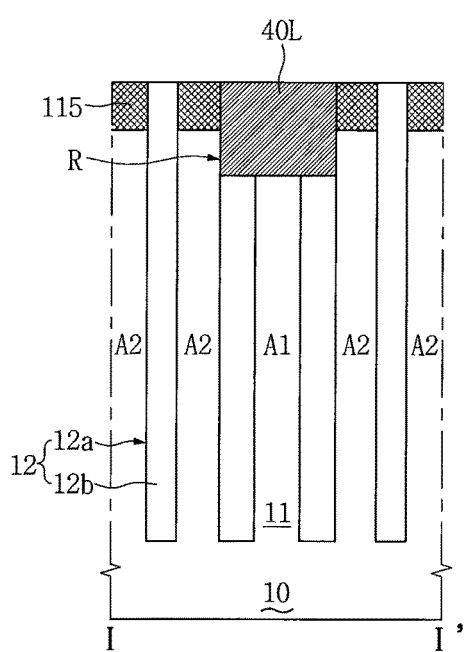
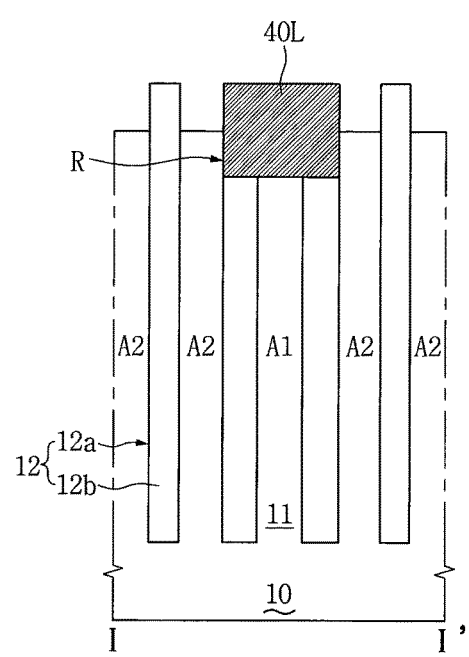

FIG. 28
FIG. 29
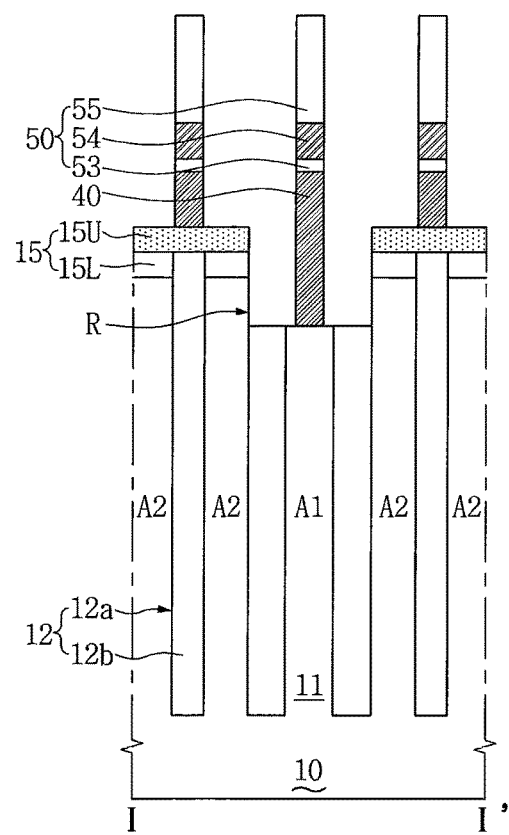
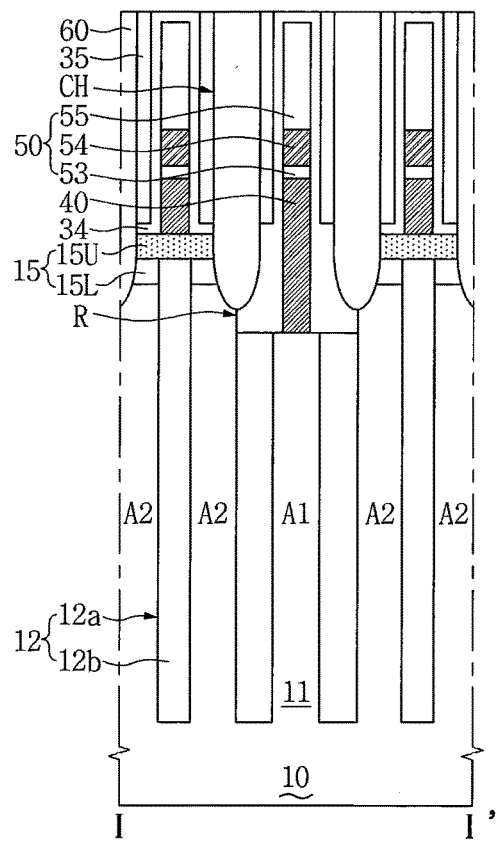

FIG. 36
FIG. 37
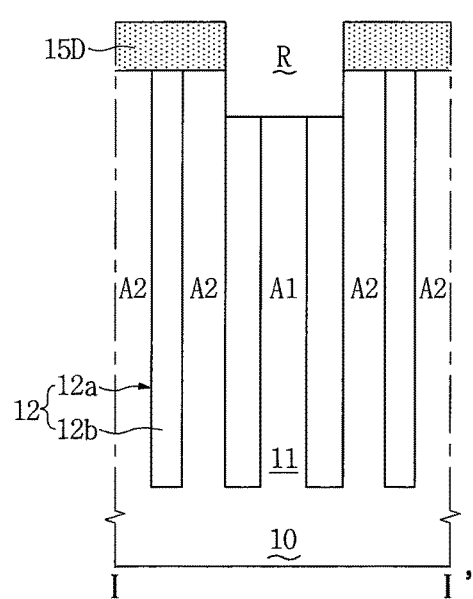
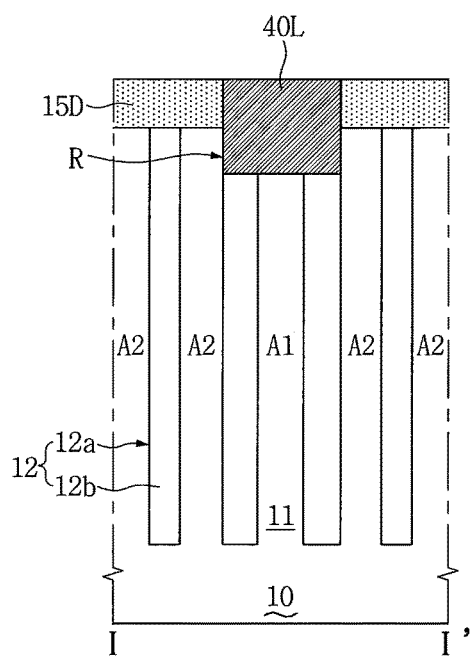

FIG. 43
FIG. 44
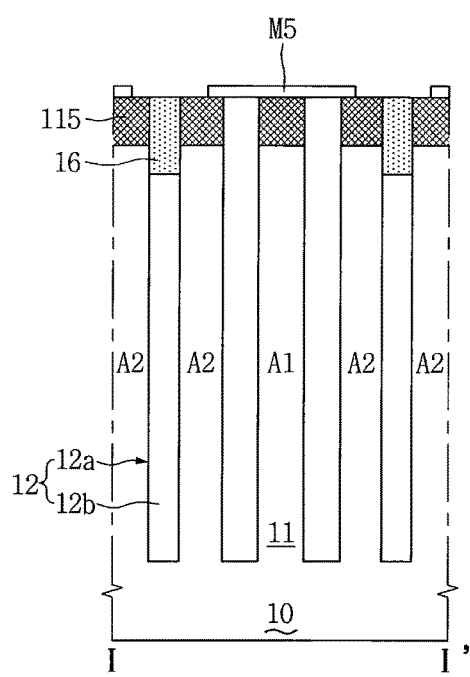
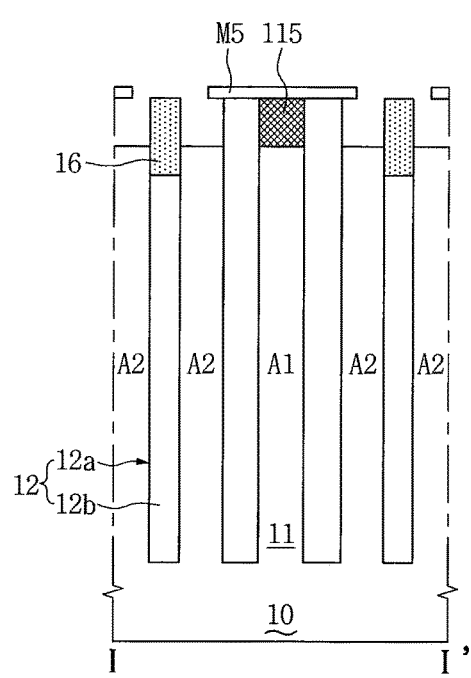

FIG. 47
FIG. 48
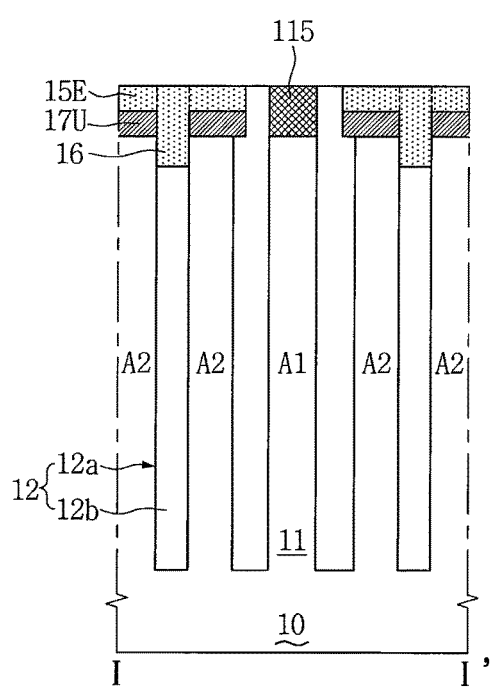
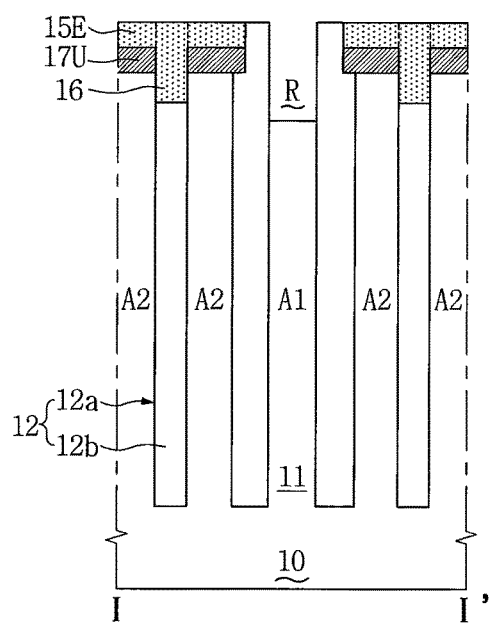

SEMICONDUCTOR DEVICES HAVING EXPANDED RECESS FOR BIT LINE CONTACT

CROSS-REFERENCE TO RELATED APPLICATION

This application claims priority under 35 U.S.C. §119 to Korean Patent Application No. 10-2014-0182320 filed on Dec. 17, 2014, the disclosure of which is hereby incorporated by reference in its entirety.

BACKGROUND

Embodiments of the inventive concepts relate to semiconductor devices and methods of fabricating the same, and more specifically to semiconductor devices having bit lines and methods of fabricating the same.

Semiconductor devices are widely used in the electronics industry because of their small size, multifunctionality, and low manufacturing cost. However, semiconductor devices have become highly integrated with the development of the electronics industry, and thus various problems may arise. For example, widths of patterns and/or intervals between patterns in semiconductor devices are being reduced due to the high integration of semiconductor devices, and thus a width of a bit-line contact hole has been reduced. Accordingly, when forming a bit-line, there is high a probability that conductive residue may be generated between a bit-line contact and an inner wall of the bit-line contact hole. As a result, a margin may be reduced between a bit-line contact and a capacitor contact, i.e., a short margin problem.

SUMMARY

In accordance with an aspect of the inventive concepts, a semiconductor device includes first and second device isolation regions defining first, second and third active regions in a substrate, a recess region in the substrate exposing an upper surface of the first active region and upper surfaces of the first and second device isolation regions, and active buffer patterns on the second and third active regions. The first active region is located between the second and third active regions, the first device isolation region is located between the first and second active regions, and the second device isolation region is located between the first and third active regions. Upper sidewalls of the second and third active regions are exposed in the recess region.

In accordance with another aspect of the inventive concepts, a semiconductor device includes first to fourth device isolation regions defining first to fifth active regions in a substrate, a recess region in the substrate exposing an upper surface of the first active region and upper surfaces of the first and second device isolation regions, and active buffer patterns on the second to fifth active regions. The first active region is located between the second and third active regions, the second active region is located between the first and fourth active regions, and the third active region is located between the first and fifth active regions. The first device isolation region is located between the first and second active regions, the second device isolation region is located between the first and third active regions, the third device isolation region is located between the second and fourth active regions, and the fourth device isolation region is located between the third and fifth active regions. Upper sidewalls of second and third active regions are exposed in the recess region.

In accordance with still another aspect of the inventive concepts, a semiconductor device includes a device isolation region defining a plurality of adjacent active regions in a substrate, wherein each of the active regions has a first contact area on a center portion and second and third contact areas on both end portions, a recess region exposing upper surfaces of the first contact areas of the active regions and upper surfaces of the device isolation region that is located at both sides of the first contact areas, and buffer patterns in the second and third contact areas of the active regions, wherein upper sidewalls of the second and third contact areas are exposed in the recess region.

In accordance with yet another aspect of the inventive concepts, a semiconductor device includes a substrate, a first device isolation region and a second device isolation region defining a first active region, a second active region, and a third active region in the substrate. The second active region is located between the first and third active regions. The first device isolation region is located between the first and second active regions. The second device isolation region is located between the second and third active regions. A first conductive region is also provided on the first active region, the first conductive region including a bottom surface adjacent the first active region and a top surface remote from the first active region. A second conductive region is provided on the second device isolation region, the second conductive region including a bottom surface adjacent the second device isolation region and a top surface remote from the second device isolation region. The top surfaces of the first and second conductive regions are coplanar and the bottom surfaces of the first and second conductive regions are not coplanar.

In some embodiments, the first conductive region is directly on the first active region and the second conductive region is directly on the second device isolation region. In some embodiments, the first and second conductive regions both comprise unitary structures of the same material from the top surfaces thereof to the bottom surfaces thereof. In some embodiments, the first conductive region is of greater height from the bottom surface thereof to the top surface thereof, than the second conductive region from the bottom surface thereof to the top surface thereof. In some embodiments, the second active region comprises a curved sidewall facing the first conductive region, and the third active region comprises a curved sidewall facing away from the first conductive region.

Details of other embodiments are included in the detailed description and drawings.

BRIEF DESCRIPTION OF THE DRAWINGS

The foregoing and other features and advantages of the inventive concepts will be apparent from the more particular description of various embodiments of the inventive concepts, as illustrated in the accompanying drawings in which like reference numerals denote the same respective parts throughout the different views. The drawings are not necessarily to scale, emphasis instead being placed upon illustrating the principles of the inventive concepts. In the drawings:

FIGS. 3A to 53 are vertical cross-sectional views taken along line I-I' of FIG. 1 or line II-II' of FIG. 1 for describing methods of fabricating semiconductor devices in accordance with embodiments of the inventive concepts;

DETAILED DESCRIPTION OF THE EMBODIMENTS

Figure 1:
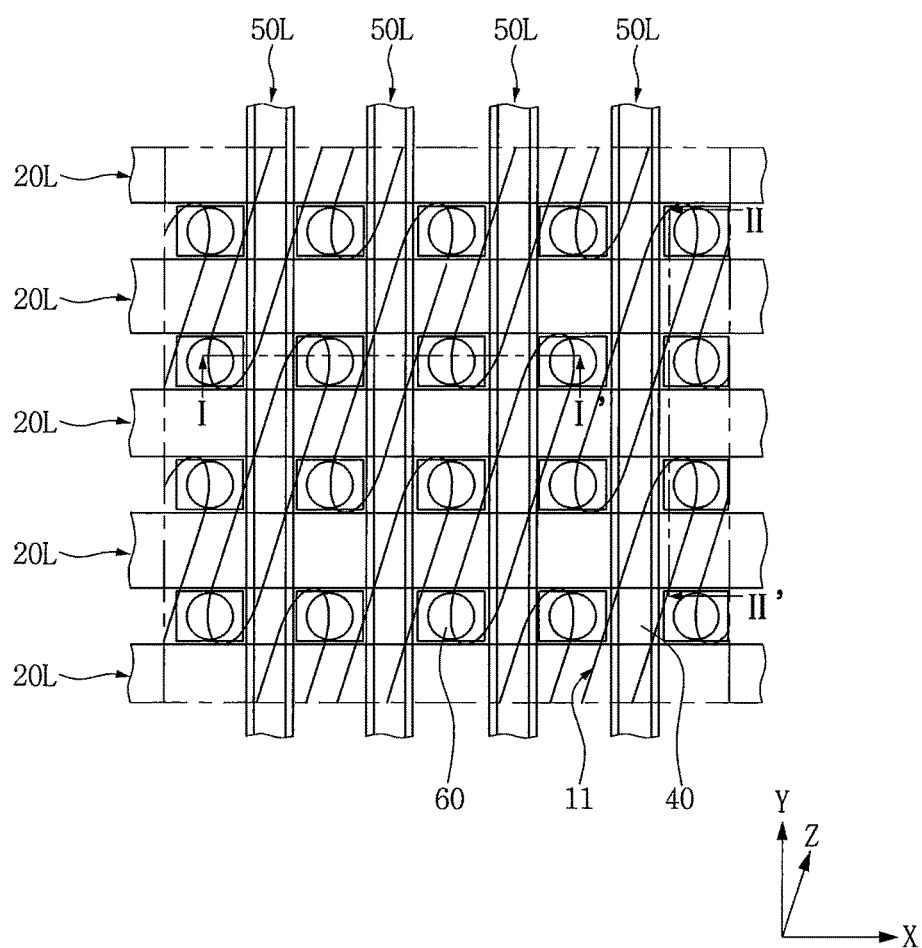
FIG. 1 is a layout schematically showing semiconductor devices in accordance with embodiments of the inventive concepts.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concepts to those skilled in the art.

The terminology used herein to describe embodiments of the inventive concepts is not intended to limit the scope of the inventive concepts. The articles "a," "an," and "the" are singular in that they have a single referent; however, the use of the singular form in the present document should not preclude the presence of more than one referent. In other words, elements of the inventive concepts referred to in the singular form may number one or more, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element or layer is referred to as being "on," "connected to," or "coupled to" another element or layer, it can be directly on, connected to, or coupled to the other element or layer or intervening elements or layers may be present. In contrast, when an element is referred to as being "directly on," "directly connected to," or "directly coupled to" another element or layer, there are no intervening elements or layers present.

Spatially relative terms, such as "beneath," "below," "lower," "above," "upper," "top", "bottom" and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Embodiments are described herein with reference to cross-sectional and/or planar illustrations that are schematic illustrations of idealized embodiments and intermediate structures. In the drawings, the sizes and relative sizes of layers and regions may be exaggerated for clarity. Therefore, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Like numerals refer to like elements throughout the specification. Accordingly, the same numerals and similar numerals can be described with reference to other drawings, even if not specifically shown in a corresponding drawing. Further, when a numeral is not marked in a drawing, the numeral can be described with reference to other drawings.

FIG. 1 is a layout schematically showing semiconductor devices in accordance with embodiments of the inventive concepts.

Referring to FIG. 1, semiconductor devices 100 in accordance with embodiments of the inventive concepts may include gate lines 20L extending in an X direction, bit-lines 50L extending in a Y direction perpendicular to the X direction, and bar-shaped active regions 11 extending in a Z direction diagonal to each of the X direction and the Y direction. The semiconductor devices 100 may further include bit-line contact plugs 40 overlapping center areas of the active regions 11 intersecting the bit-lines 50L, and capacitor contact plugs 60 overlapping both ends of the active regions 11. The active regions 11 may be disposed to be staggered from each other in the X direction as shown in FIG. 1.

Figure 2A:
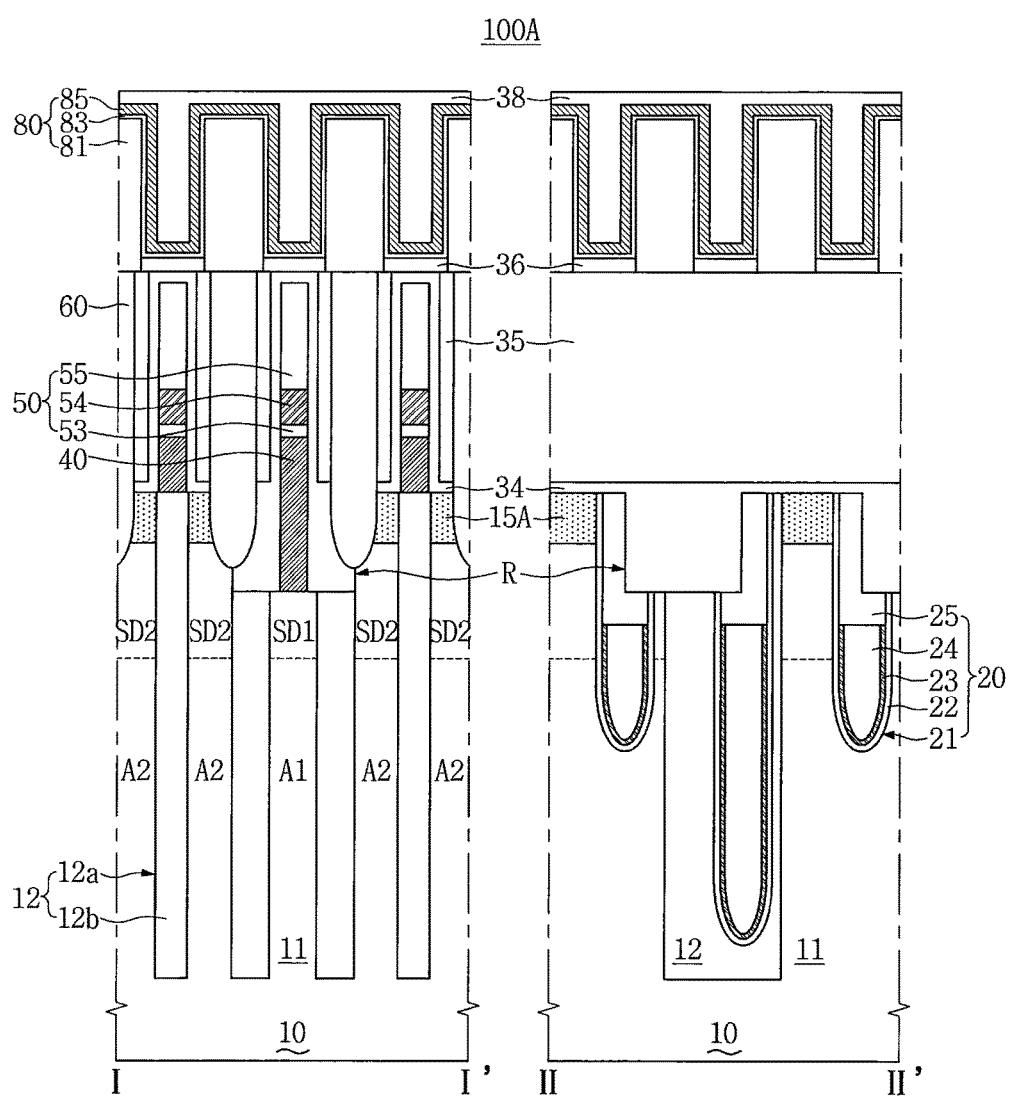
FIGS. 2A to 2E are vertical cross-sectional views taken along line I-I' of FIG. 1 or line II-II' of FIG. 1 for describing semiconductor devices in accordance with various embodiments of the inventive concepts.

FIG. 2A is vertical cross-sectional views taken along line I-I' and line II-II' of FIG. 1 for describing a semiconductor device 100A in accordance with embodiments of the inventive concepts.

Referring to FIGS. 1 and 2A, the semiconductor device 100A in accordance with embodiments of the inventive concepts may include device isolation regions 12 in a substrate 10 and defining active regions 11, active buffer patterns 15A, gate structures 20, bit-line structures 50, and capacitor structures 80. The substrate may be a semiconductor substrate (e.g., comprising silicon, silicon germanium (SiGe), germanium (Ge), and/or gallium arsenic (GaAs)) and/or a semiconductor-on-silicon wafer such as a silicon-on-insulator (SOI) wafer. The semiconductor device 100A may further include a bit-line contact plug 40 extending between the substrate 10 and the bit-line structures 50. The semiconductor device 100A may further include capacitor contact plugs 60 formed between the substrate 10 and the capacitor structures 80. The semiconductor device 100A may further include a spacer layer 34, an interlayer insulating layer 35, an etch stop layer 36, and a capacitor capping insulating layer 38. The active buffer patterns 15A may be formed on both ends of the active regions 11.

The device isolation regions 12 may include a device isolation trench 12a in the substrate 10, and a device isolation insulating material 12b in, and in some embodiments filling, the device isolation trench 12a. The device isolation insulating material 12b may include silicon oxide.

The active regions 11 may include a center portion A1 and end portions A2. For example, the center portion A1 of the active regions 11 may include a first contact region in contact with the bit-line contact plugs 40, and both of the end portions A2 of the active regions 11 may include second and third contact regions in contact with the capacitor contact plugs 60. The center portion A1 of the active regions 11 may include first source/drain areas SD1 in contact with the bit-line contact plugs 40, and both of the end portions A2 of the active regions 11 may include second source/drain areas SD2 in contact with the capacitor contact plugs 60. The first source/drain area SD1 and the second source/drain areas SD2 may include N-type impurities, such as phosphorus (P) and/or arsenic (As).

Upper portions of both of the end portions A2 of the active regions 11 may be recessed toward a bottom surface of the substrate 10. Accordingly, upper surfaces of both of the end portions A2 of the active regions 11 may be at levels lower than an upper surface of the device isolation region 12 between the end portions A2 of the active regions 11.

The active buffer patterns 15A may be formed on both of the recessed end portions A2 of the active regions 11. Upper surfaces of the active buffer patterns 15A may be coplanar with the upper surface of the device isolation region 12 between the end portions A2 of the active regions 11. Side surfaces of the active buffer patterns 15A may be vertically aligned with side surfaces of both of the end portions A2 of the active regions 11. The active buffer patterns 15A may include silicon nitride.

The substrate 10 may include a recess region R which exposes upper surfaces of the center portion A1 of the active regions 11 and the upper surfaces of the device isolation regions 12 located at both sides of the center portion A1. The width of the recess region R may be substantially the same as a sum of the width of the center portion A1 of the active regions 11 and the widths of the device isolation regions 12 located at both sides of the center portion A1. Also, an upper surface of the center portion A1 of the active regions 11 that is exposed in the recess region R may be at a level lower than the upper surfaces of both of the end portions A2 of the active regions 11.

Also, upper side surfaces of both of the end portions A2 of active regions 11 adjacent to the center portion A1 of each active region 11 may be exposed in the recess region R. The gate structures 20 may be exposed in the recess region R. For example, gate capping insulating patterns 25 of the gate structures 20 may be exposed in the recess region R.

The gate structures 20 may include a gate insulating layer 22, a gate barrier pattern 23, a gate electrode pattern 24, and a gate capping insulating pattern 25 which extend in a gate trench 21. The gate structures 20 may be buried in the substrate 10. An upper surface of the gate electrode pattern 24 of each gate structure 20 may be at a level lower than a bottom surface of the recess region R.

The gate trench 21 may extend from a surface of the substrate 10 toward the inside of the substrate 10.

The gate insulating layer 22 may extend conformally on an entire inner wall of the gate trench 21. The gate insulating layer 22 may include silicon oxide, silicon nitride, silicon oxynitride and/or a metal oxide. The metal oxide may include hafnium oxide, aluminum oxide and/or titanium oxide.

The gate barrier pattern 23 may extend conformally on the gate insulating layer 22. The gate barrier pattern 23 may extend on only a lower portion of the gate trench 21. The gate barrier pattern 23 may include a barrier metal compound such as titanium nitride (TiN) and/or tantalum nitride (TaN).

The gate electrode pattern 24 may extend on the gate barrier pattern 23 to partially fill the gate trench 21. For example, in some embodiments the gate electrode pattern 24 may fill the lower portion of the gate trench 21. The gate electrode pattern 24 may include a metal such as tungsten and/or copper.

In some embodiments, the gate capping insulating pattern 25 may extend on the gate insulating layer 22 and the gate electrode pattern 24 to fill the gate trench 21. The gate capping insulating pattern 25 may include silicon nitride.

The bit-line contact plugs 40 may extend on the center portions A1 of the active regions 11 of the substrate 10. The bit-line contact plugs 40 may electrically connect the first source/drain areas SD1 of the active regions 11 to the bit-line structures 50. The bit-line contact plugs 40 may be located in the recess region R. For example, lower portions of the bit-line contact plugs 40 may be located in the recess region R. Upper portions of the bit-line contact plugs 40 may protrude from a surface of the substrate 10. Accordingly, bottom surfaces of the bit-line contact plugs 40 may be located inside the substrate 10.

The bit-line structures 50 may each include a bit-line barrier pattern 53, a bit-line electrode pattern 54, and a bit-line capping pattern 55.

The bit-line barrier pattern 53 may be formed on the bit-line contact plugs 40. The bit-line barrier pattern 53 may be in contact with and electrically connected to the bit-line contact plugs 40. The bit-line barrier pattern 53 may include a metal and/or a metal compound such as titanium (Ti), titanium nitride (TiN), titanium silicide (TiSi), tantalum (Ta), tantalum nitride (TaN), tantalum silicide (TaSi), nickel silicide (NiSi), cobalt silicide (CoSi), tungsten nitride (WN) and/or tungsten silicide (WSi).

The bit-line electrode pattern 54 may extend on the bit-line barrier pattern 53. The bit-line electrode pattern 54 may include a metal such as tungsten and/or copper.

The bit-line capping pattern 55 may extend on the bit-line electrode pattern 54. The bit-line capping pattern 55 may include silicon nitride.

Sidewalls of bit-line contact plugs 40, the bit-line barrier pattern 53, the bit-line electrode pattern 54, and the bit-line capping pattern 55 may be vertically aligned.

The spacer layer 34 may surround the bit-line structures 50 and the bit-line contact plugs 40. For example, the spacer layer 34 may extend conformally on top and side surfaces of the bit-line structures 50 and side surfaces of the bit-line contact plugs 40. The spacer layer 34 may be in, and in some embodiments may fill, the recess region R. The spacer layer 34 may include silicon nitride.

The interlayer insulating layer 35 may surround side surfaces of the spacer layer 34. An upper surface of the spacer layer 34 and an upper surface of the interlayer insulating layer 35 may be coplanar. The interlayer insulating layer 35 may include silicon oxide and/or silicon nitride.

The capacitor contact plugs 60 may vertically pass through the interlayer insulating layer 35 and the spacer layer 34 to be in contact with both of the end portions A2 of the active regions 11 of the substrate 10. The capacitor contact plugs 60 may electrically connect the second source/drain areas SD2 of the active regions 11 of the substrate 10 with the capacitor structures 80. Parts of upper ends of both of the end portions A2 of the active regions 11 and parts of the active buffer patterns 15A may be recessed by the capacitor contact plugs 60. Bottom surfaces of the capacitor contact plugs 60 may be located at a level lower than top surfaces of both of the end portions A2 of the active regions 11. The capacitor contact plugs 60 may include doped polysilicon, a metal, a metal silicide and/or a metal compound. The upper surfaces of the spacer layer 34 and the interlayer insulating layer 35, and an upper surface of the capacitor contact plug 60 may be coplanar.

The etch stop layer 36 may extend on the spacer layer 34 and the interlayer insulating layer 35. The etch stop layer 36 may include, for example, silicon nitride.

Each of the capacitor structures 80 may include a capacitor lower electrode 81, a capacitor dielectric layer 83, and a capacitor upper electrode 85.

The capacitor lower electrodes 81 may be electrically connected to the capacitor contact plugs 60. The capacitor lower electrodes 81 may overlap the capacitor contact plugs 60. The capacitor lower electrodes 81 may vertically pass through the etch stop layer 36. The capacitor lower electrodes 81 may include a conductive material such as doped polysilicon, a metal and/or a metal compound.

The capacitor dielectric layer 83 may conformally cover surfaces of the capacitor lower electrodes 81. For example, the capacitor dielectric layer 83 may extend on top and side surfaces of the capacitor lower electrodes 81. The capacitor dielectric layer 83 may extend onto the etch stop layer 36. In other words, the capacitor dielectric layer 83 may extend conformally on a surface of the etch stop layer 36. The capacitor dielectric layer 83 may include one of a metal oxide, such as hafnium oxide, aluminum oxide, titanium oxide, tantalum oxide, ruthenium oxide, and lanthanum oxide, silicon oxide, or silicon nitride.

The capacitor upper electrode 85 may extend conformally on the capacitor dielectric layer 83. The capacitor upper electrode 85 may include a metal and/or a metal compound.

The capacitor capping insulating layer 38 may extend in, and in some embodiments may fill, gaps between the capacitor structures 80 and in some embodiments may cover the capacitor structures 80. The capacitor capping insulating layer 38 may include silicon oxide.

The semiconductor device 100A according to embodiments of the inventive concepts has been described above. In the semiconductor device 100A according to embodiments of the inventive concepts, a width of a recess region that exposes a center portion of active regions may be expanded to both of end portions of the adjacent active regions. Accordingly, when an etching process for forming a bit-line is performed, conductive residue may be reduced or prevented from being generated between a bit-line of the center portion of the active regions and both of the end portions of the adjacent active regions.

Therefore, a short margin between a bit-line contact and a capacitor contact may be improved by reducing or preventing the conductive residue from being generated between the bit-line and both of the end portions of the adjacent active regions when the bit-line is formed.

Also, in the semiconductor device 100A according to embodiments of the inventive concepts, a buffer pattern having the same shapes as both of the end portions of the active regions may be provided on both of the end portions of the active regions. Accordingly, the recess region may be expanded using the buffer pattern as a mask. Also, since an alignment process is performed based on the buffer pattern when bit-lines are formed, misalignment of the bit-lines may be reduced or prevented.

FIGS. 2B to 2E are vertical cross-sectional views taken along line I-I' of FIG. 1 for describing semiconductor devices (100B to 100E) in accordance with various embodiments of the inventive concepts.

Figure 2B:
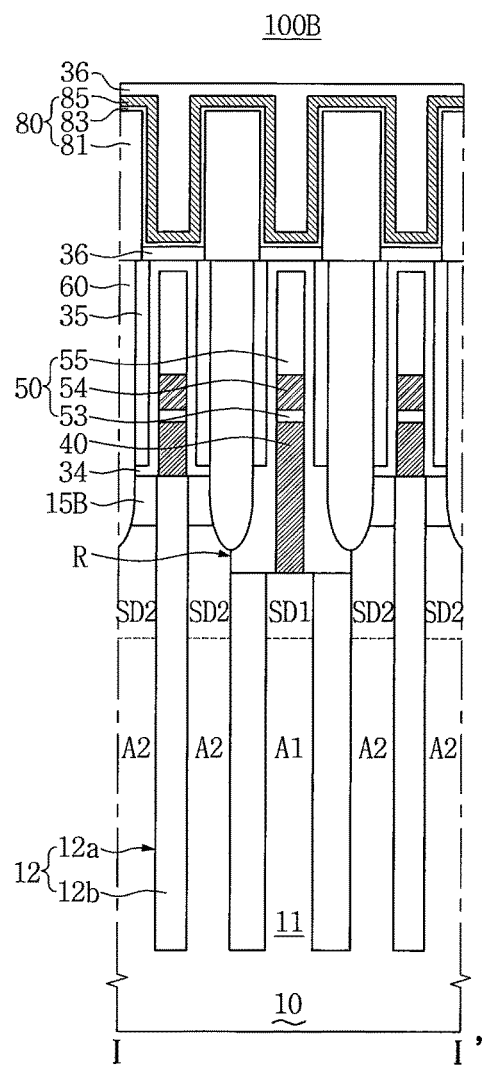

Referring to FIGS. 1 and 2B, active buffer patterns 15B of the semiconductor device 100B according to embodiments of the inventive concepts may include silicon oxide, compared to the semiconductor device 100A in FIG. 2A. As also illustrated in FIG. 2B, a first device isolation region and a second device isolation region define a first active region, a second active region and a third active region in the substrate. The second active region is located between the first and third active regions. The first device isolation region is located between the first and second active regions. The second device isolation region is located between the second and third active regions. A first conductive region is provided on the first active region. The first conductive region includes a bottom surface adjacent the first active region and a top surface remote from the first active region. A second conductive region is provided on the second device isolation region. The second conductive region includes a bottom surface adjacent the second device isolation region and a top surface remote from the second device isolation region. The top surfaces of the first and second conductive regions are coplanar, and the bottom surfaces of the first and second conductive regions are not coplanar. Moreover, the first conductive region is directly on the first active region and the second conductive region is directly on the second device isolation region. The first and second conductive regions both comprise unitary structures of the same material from the top surfaces thereof to the bottom surfaces thereof. Moreover, the first conductive region is of greater height from the bottom surfaces thereof to the top surface thereof, than the second conductive region from the bottom surface thereof to the top surface thereof. Finally, the second active region comprises a curved sidewall facing the first conductive region and the third active region comprises a curved sidewall facing away from the first conductive region.

Figure 2C:
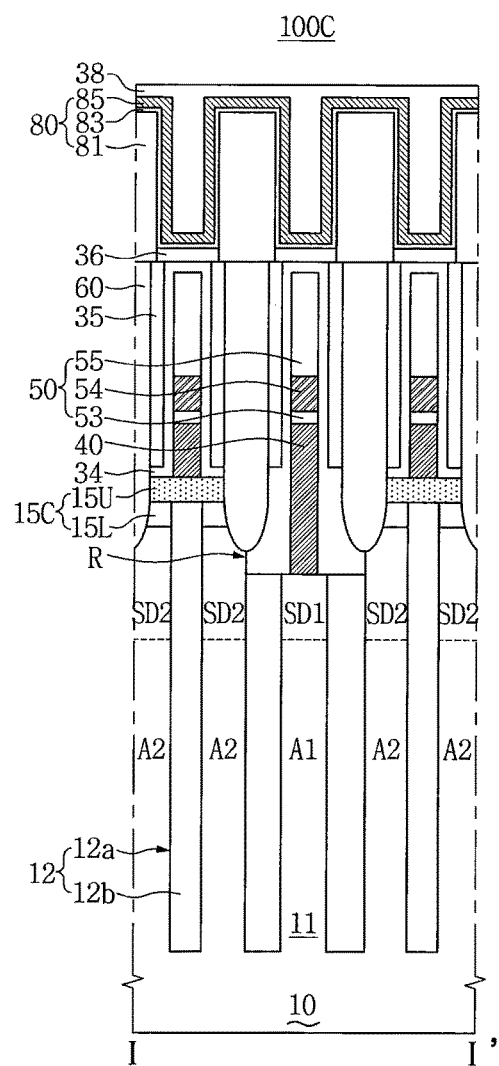

Referring to FIGS. 1 and 2C, active buffer patterns 15C of the semiconductor device 100C according to embodiments of the inventive concepts may each include lower active buffer patterns 15L and upper active buffer patterns 15U, compared to the semiconductor device 100A in FIG. 2A. For example, the active buffer patterns 15C may include lower active buffer patterns 15L on both of the end portions A2 of the active regions 11, an upper active buffer pattern 15U on two lower active buffer patterns 15L adjacent in the X-axis direction, and the device isolation region 12 between the two adjacent lower active buffer patterns 15L. In other words, the upper active buffer pattern 15U may extend on, and in some embodiments may cover, the two lower active buffer patterns 15L adjacent in the X-axis direction and the device isolation region 12 between the two adjacent lower active buffer patterns 15L. Upper surfaces of the two lower active buffer patterns 15L adjacent to one another in the X-axis direction may be coplanar with an upper surface of the device isolation region 12 between the two adjacent lower active buffer patterns 15L. The lower active buffer patterns 15L may include silicon oxide. The upper active buffer pattern 15U may include silicon nitride.

Figure 2D:
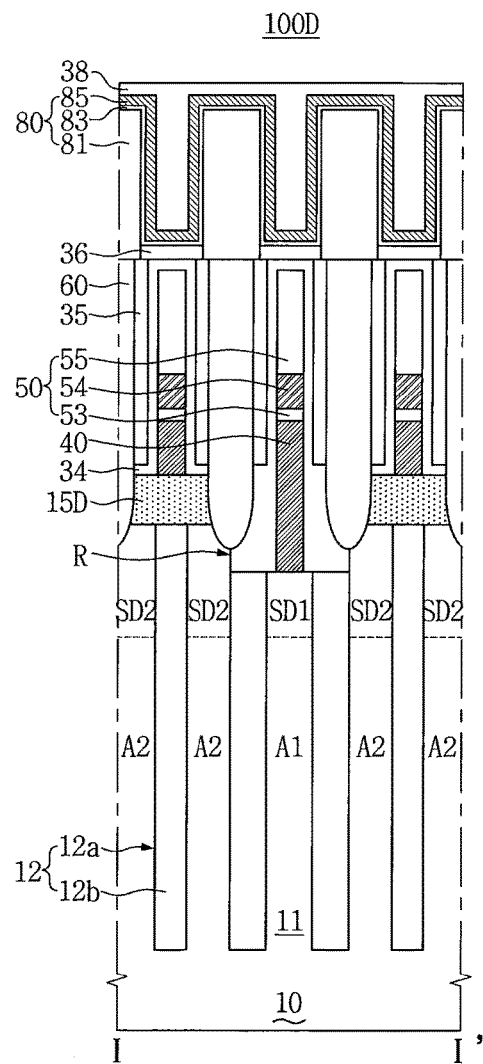

Referring to FIGS. 1 and 2D, active buffer patterns 15D of the semiconductor device 100D according to embodiments of the inventive concepts may be provided on both of end portions A2 of two active regions 11 adjacent in the X-axis direction and a device isolation region 12 between the end portions A2 of the two adjacent active regions 11, compared to the semiconductor device 100A in FIG. 2A. Upper surfaces of both of the end portions A2 of the two adjacent active regions 11 may be coplanar with an upper surface of the device isolation region 12 between the end portions A2 of the two adjacent active regions 11. The active buffer patterns 15D may include silicon nitride.

Figure 2E:
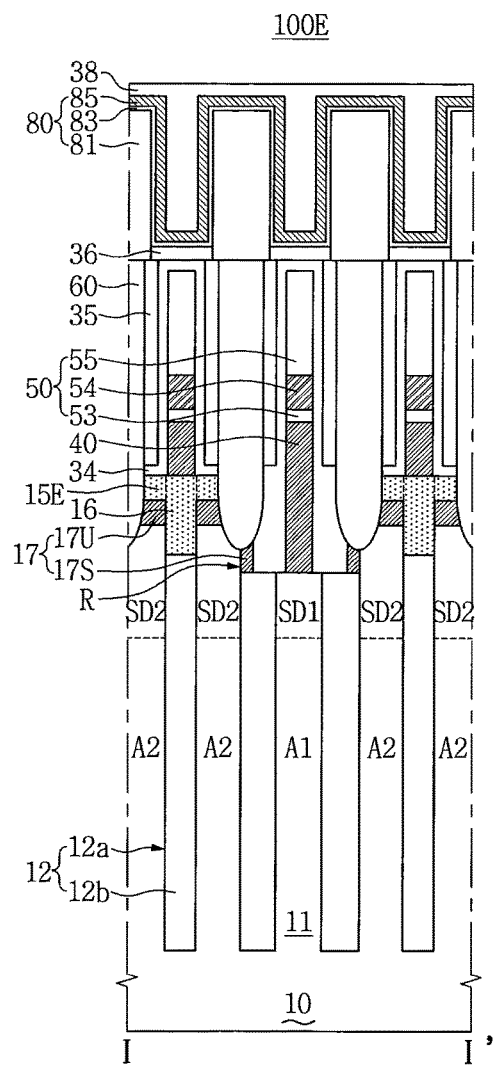

Referring to FIGS. 1 and 2E, the semiconductor device 100E according to embodiments of the inventive concepts may include contact pads 17 on both of end portions A2 of active regions 11, active buffer patterns 15E on the contact pads 17, and device isolation buffer patterns 16 extending on a device isolation region 12 between the end portions A2 of two active regions 11 adjacent in the X-axis direction, compared to the semiconductor device 100A in FIG. 2A.

The contact pads 17 may include upper contact pads 17U on upper surfaces of both of the end portions A2 of the active regions 11 and side contact pads 17S on sidewalls of both of the end portions A2 of the active regions 11. For example, the upper contact pads 17U may be located between upper surfaces of both of the end portions A2 of the active regions 11 and the active buffer patterns 15E. The side contact pads 17S may be located on upper sidewalls of both of the end portions A2 of the active regions 11 that are exposed in the recess region R. The upper contact pads 17U and the side contact pads 17S may include polysilicon. Capacitor contact plugs 60 may be in contact with both the upper contact pads 17U and the side contact pads 17S.

Upper surfaces of the active buffer patterns 15E may be coplanar with upper surfaces of the device isolation buffer patterns 16. The active buffer patterns 15E and the device isolation buffer patterns 16 may include silicon nitride. Accordingly, boundaries (dashed lines) between the active buffer patterns 15E and the device isolation buffer patterns 16 may disappear.

FIGS. 3A to 15B are vertical cross-sectional views taken along lines I-I' and II-II' of FIG. 1 for describing a method of fabricating a semiconductor device and a device so fabricated in accordance with embodiments of the inventive concepts.

Figure 3A:
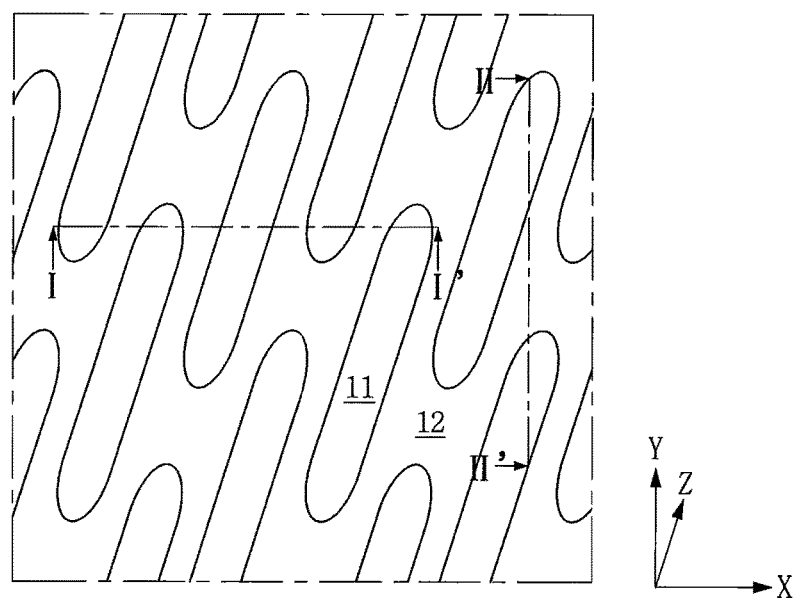
Figure 3B:
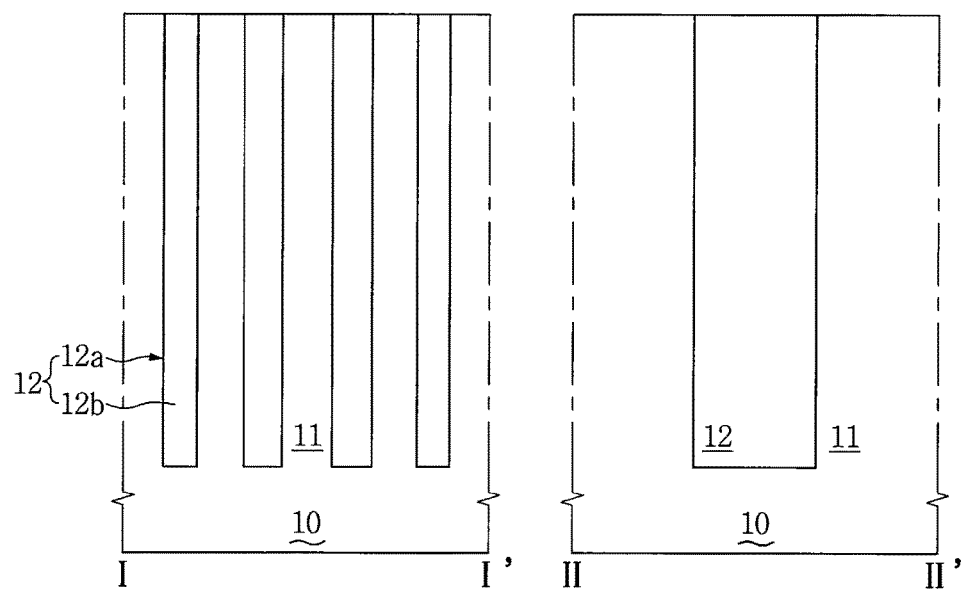

Referring to FIGS. 3A and 3B, a method of fabricating a semiconductor device 100A in accordance with embodiments of the inventive concepts may include forming a device isolation region 12 defining active regions 11 in a substrate 10. The forming of the device isolation region 12 may include performing a shallow trench isolation (STI) process. The STI process may include forming a device isolation trench 12a in the substrate 10 in, and in some embodiments filling, the device isolation trench 12a with a device isolation insulating material 12b. The device isolation insulating material 12b may include silicon oxide.

Figure 4:
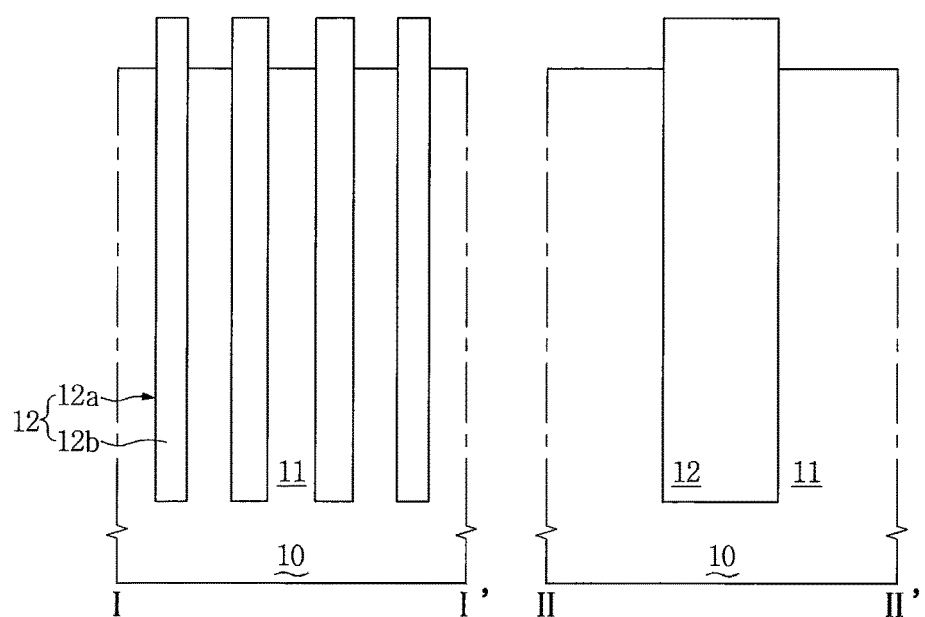

Referring to FIG. 4, the method may include recessing upper portions of the active regions 11 by performing an etching process. As the upper portions of the active regions 11 are recessed, upper surfaces of the active regions 11 may be at a level lower than an upper surface of the device isolation region 12. The upper portions of the active regions 11 may be recessed to have a depth in a range of 150 Å to 200 Å, but the depth is not limited thereto.

Figure 5A:
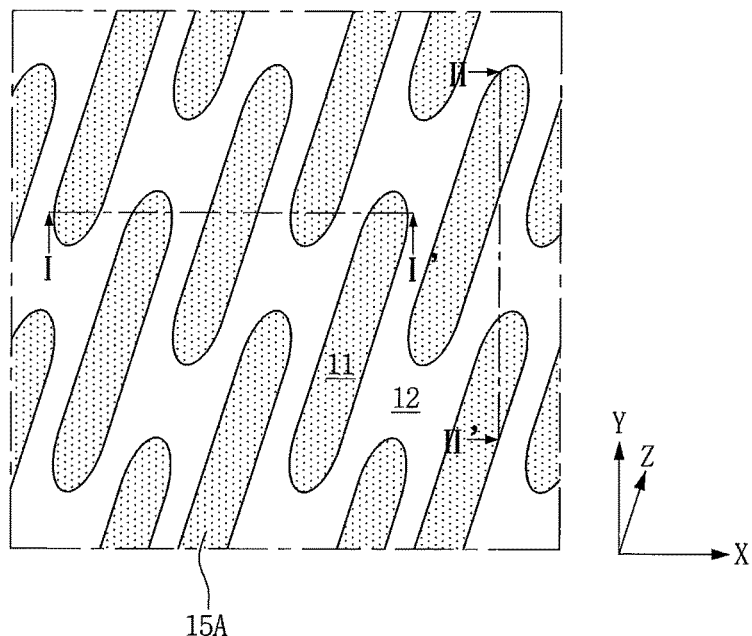
Figure 5B:
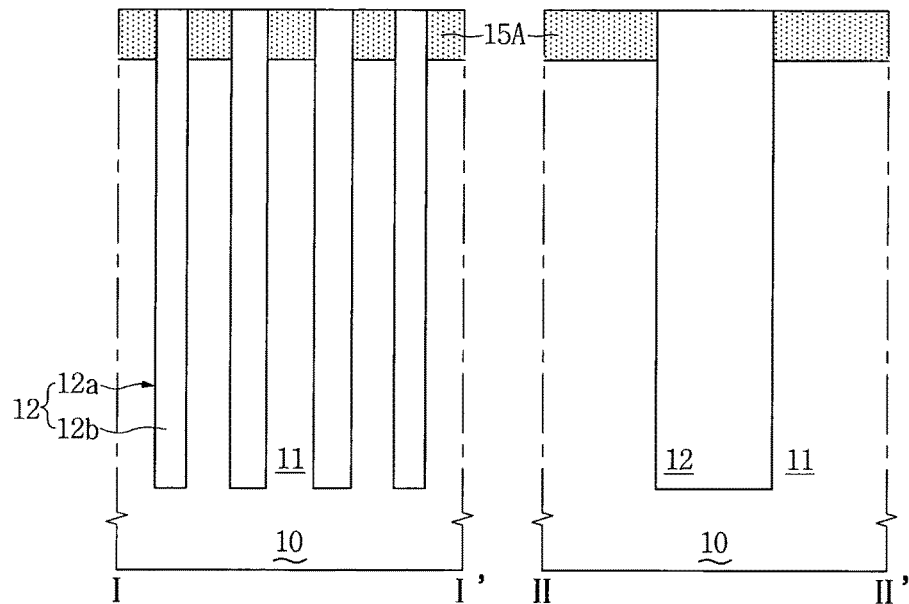

Referring to FIGS. 5A and 5B, the method may include forming active buffer patterns 15A on the recessed active regions 11. The active buffer patterns 15A may include silicon nitride. The forming of the active buffer patterns 15A may include forming a silicon nitride layer on the recessed active regions 11 and the device isolation region 12 by performing a deposition process, and removing the silicon nitride layer to be exposed the device isolation region 12 by performing a planarization process. Accordingly, the upper surfaces of the active buffer patterns 15A are coplanar with the upper surface of the device isolation region 12. The planarization process may include a chemical mechanical polishing (CMP) and/or etch-back process.

Figure 6A:
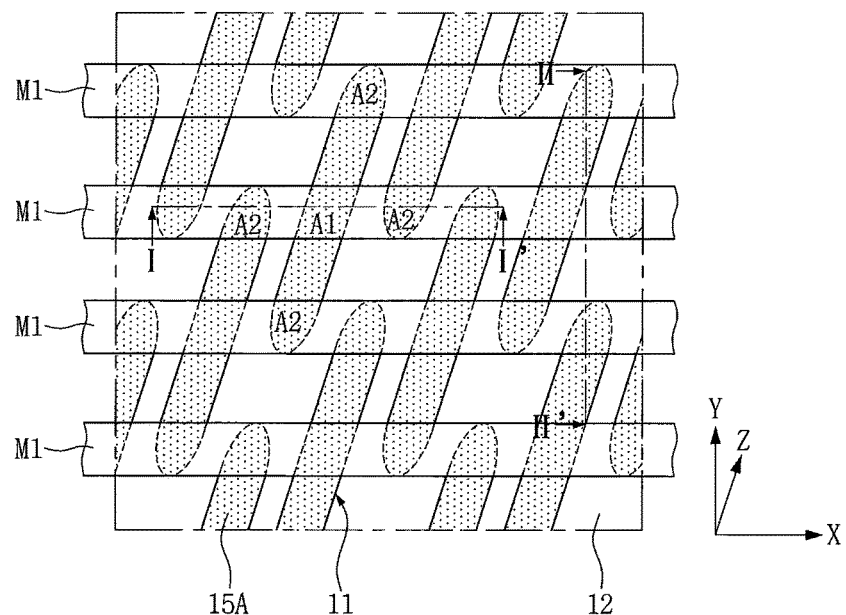
Figure 6B:
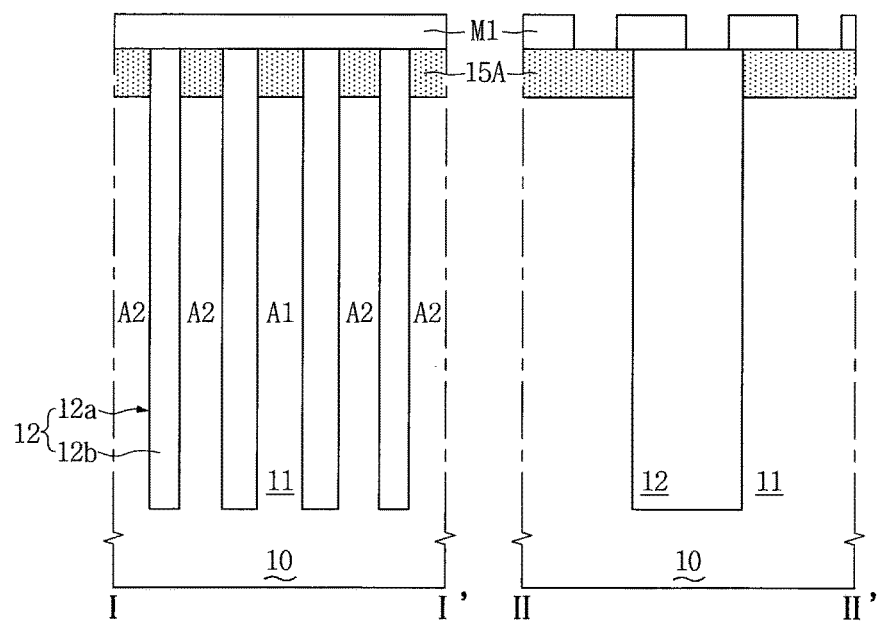

Referring to FIGS. 6A and 6B, the method may include forming first mask patterns M1 on the active buffer patterns 15A and the device isolation region 12. The first mask patterns M1 may be mask patterns for forming gate structures 20 in the substrate 10. Each of the first mask patterns M1 may extend in the X direction. Each of the first mask patterns M1 may be disposed to be spaced apart in the Y direction in parallel with each other. For example, the first mask patterns M1 may cover the center portion A1 and both of the end portions A2 of the active regions 11. Accordingly, portions between the center portion A1 and both of the end portion A2 of the active regions 11 may be exposed. The first mask patterns M1 may include silicon oxide.

Figure 7A:
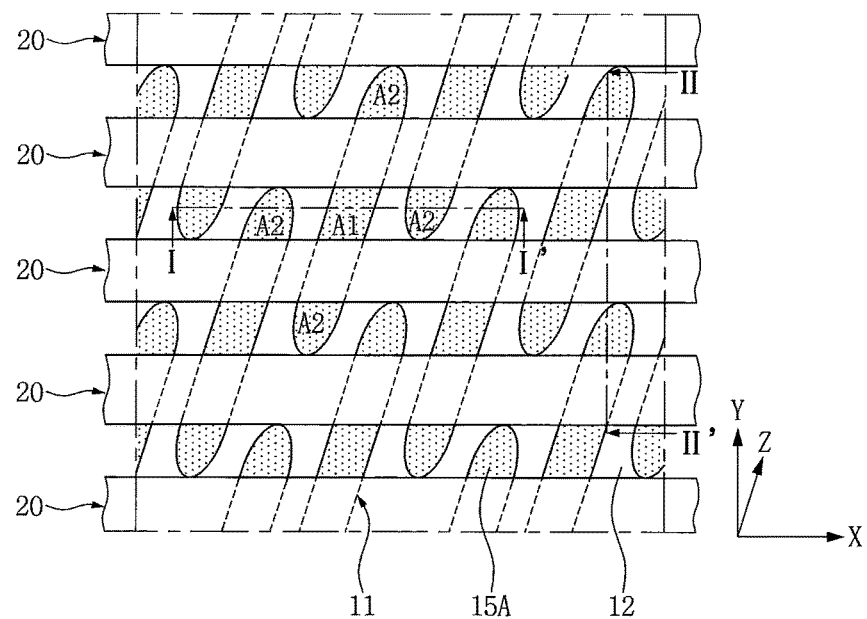
Figure 7B:
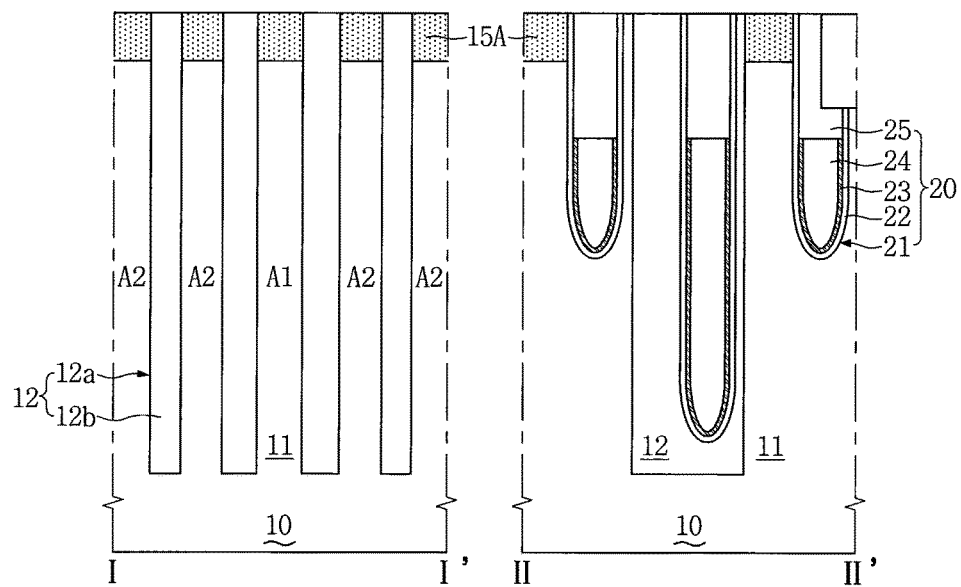

Referring to FIGS. 7A and 7B, the method may include forming gate structures 20 in the substrate 10 and removing the first mask patterns M1. Each of the gate structures 20 may extend in the X direction. Each of the gate structures 20 may be disposed to be spaced apart in the Y direction in parallel with each other. For example, each of the gate structures 20 may be disposed between the center portion A1 and both of the end portions A2 of the active regions 11. For example, the forming of the gate structures 20 in the substrate 10 may include the following processes.

First, the processes may include forming gate trenches 21 in the substrate 10 by performing an etching process using the first mask patterns M1 as an etching mask.

Next, the processes may include conformally forming a gate insulating layer 22 on inner walls of the gate trenches 21 and a surface of the first mask patterns M1. The gate insulating layer 22 may include silicon oxide and/or a metal oxide. The metal oxide may include hafnium oxide, aluminum oxide and/or titanium oxide. The gate insulating layer 22 may be formed using, for example, an atomic layer deposition (ALD) process and/or a thermal oxidation process. When the gate insulating layer 22 is formed using a thermal oxidation process, the gate insulating layer 22 may not be formed on a surface of the first mask patterns M1.

Next, the processes may include conformally forming a gate barrier layer on the gate insulating layer 22. The gate barrier layer may be formed by performing an ALD process. The gate barrier layer may include a barrier metal compound such as titanium nitride TiN and/or tantalum nitride TaN.

Next, the processes may include forming a gate electrode layer in, and in some embodiments filling, the gate trench 21 on the gate barrier layer. The gate electrode layer may be formed by performing an ALD and/or chemical vapor deposition (CVD) process. The gate electrode layer may include a metal such as tungsten and/or copper.

Next, the processes may include forming a gate barrier pattern 23 and a gate electrode pattern 24 by partially removing upper portions of the gate barrier layer and the gate electrode layer in the gate trench 21 by performing an etch back process. At this time, an upper surface of the gate barrier pattern 23 is coplanar with an upper surface of the gate electrode pattern 24.

Next, the processes may include forming a gate capping insulating pattern 25 in, and in some embodiments filling, the gate trench 21 on the gate insulating layer 22, the gate barrier pattern 23 and the gate electrode pattern 24. The gate capping insulating pattern 25 may include silicon nitride. By performing above processes, the gate structures 20 buried in the substrate 10 may be formed.

Figure 8A:
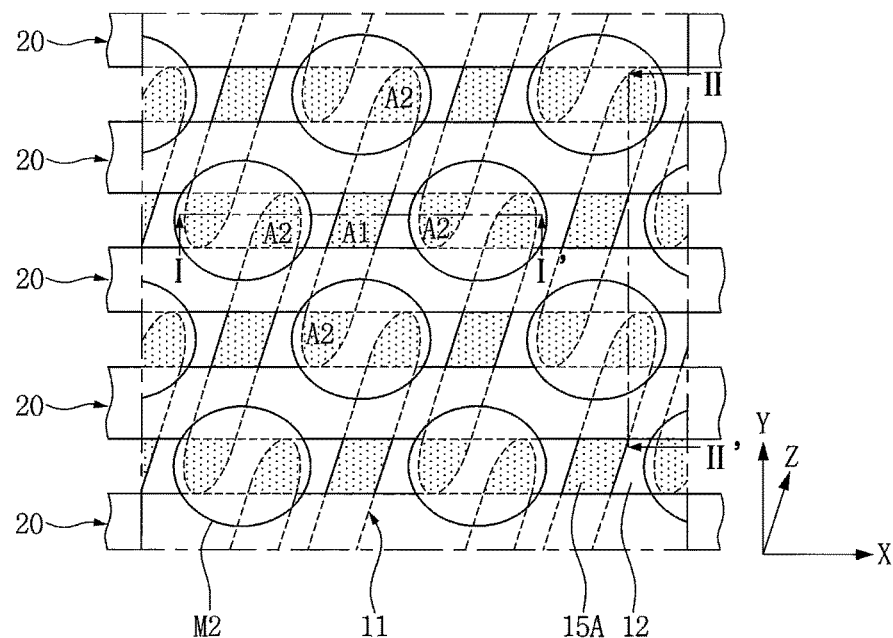
Figure 8B:
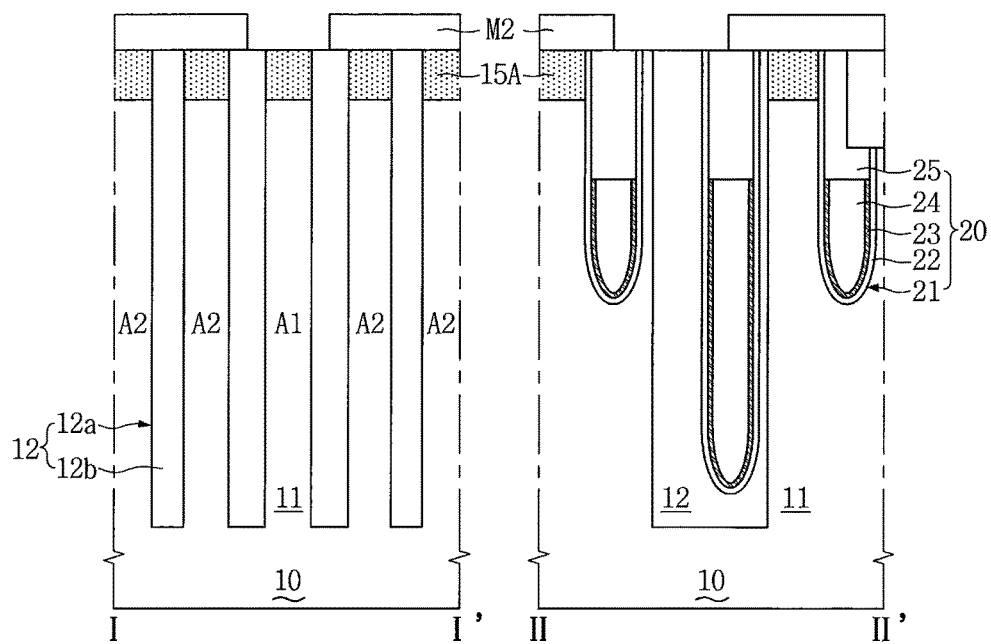

Referring to FIGS. 8A and 8B, the method may include forming second mask patterns M2 on the substrate 10. The second mask patterns M2 may be mask patterns for recessing the center portion A1 of the active regions 11. The second mask pattern M2 may include silicon oxide. The second mask patterns M2 may be disposed in an island form. The second mask patterns M2 may be on, and in some embodiments cover, both of the end portions A2 of the active regions 11. For example, the second mask patterns M2 may cover end portions A2 of two active regions 11 adjacent in the X-axis direction. Accordingly, only the center portion A1 of the active regions 11 may be exposed.

Figure 9A:
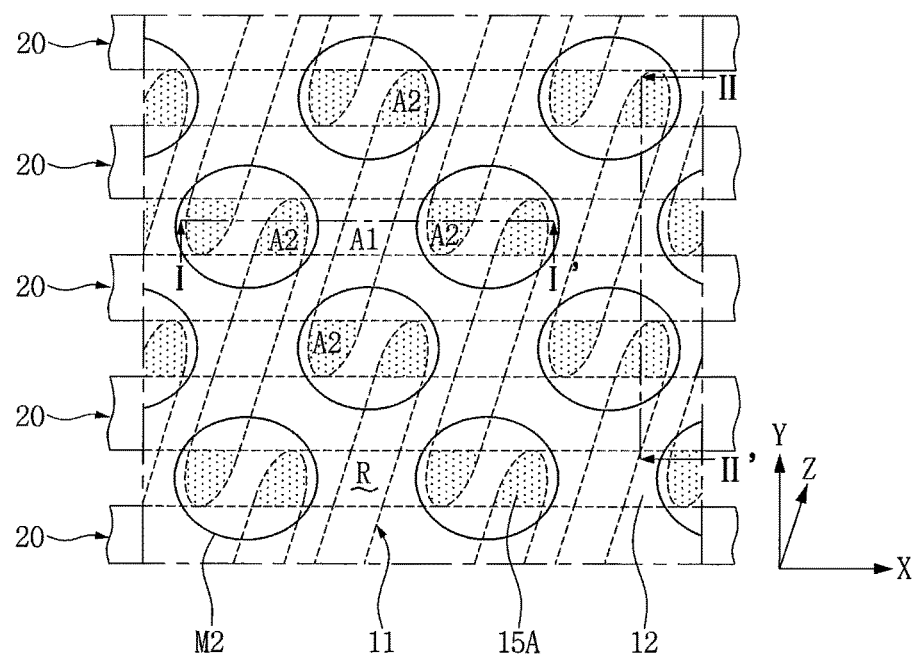
Figure 9B:
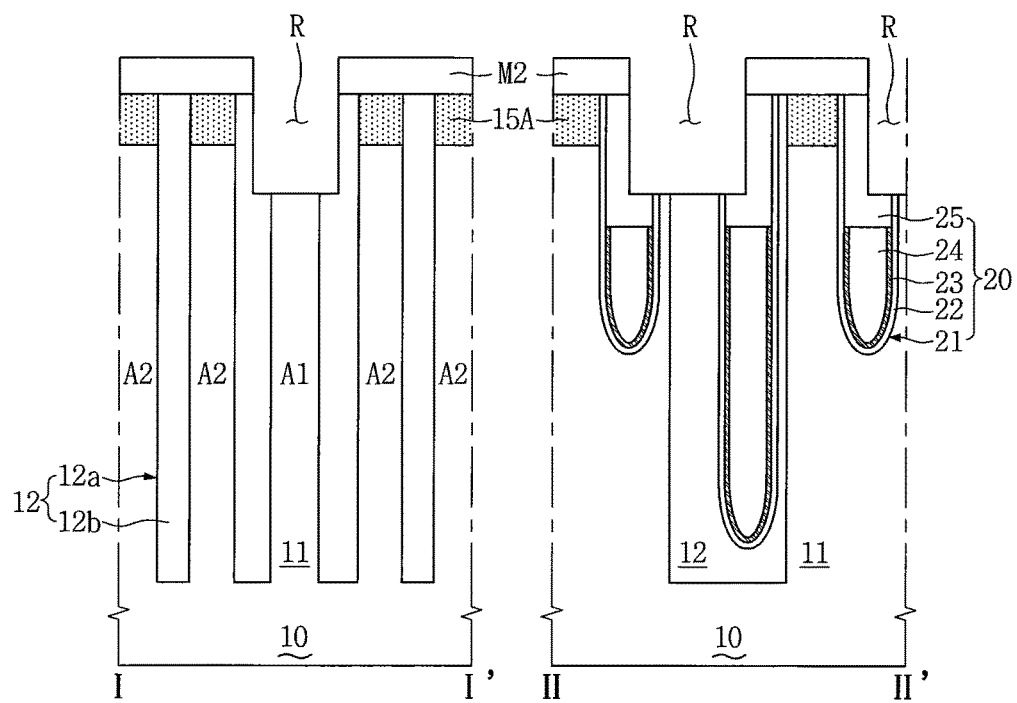

Referring to FIGS. 9A and 9B, the method may include forming a recess region R in the substrate 10 by performing an etching process using the second mask patterns M2 as an etching mask. At this time, both of the end portions A2 of the active regions 11 may be covered by the second mask pattern M2, and the center portion A1 of the active regions 11 may be exposed. Accordingly, the center portion A1 of the active regions 11 may be recessed and both of the end portions A2 of the active region 11 may not be recessed. The recess region R may also include the center portion A1 of the active regions 11 in addition to a part of the device isolation region 12 is located at both sides of the center portion A1 of the active regions 11.

Upper surfaces of the center portion A1 of the active regions 11 exposed in the recess region R may be at a level lower than upper surfaces of both of the end portions A2 of the active regions 11. Also, the upper surfaces of the center portion A1 of the active regions 11 may be at a level higher than upper surfaces of the gate electrode patterns 24 of the gate structures 20.

Figure 10A:
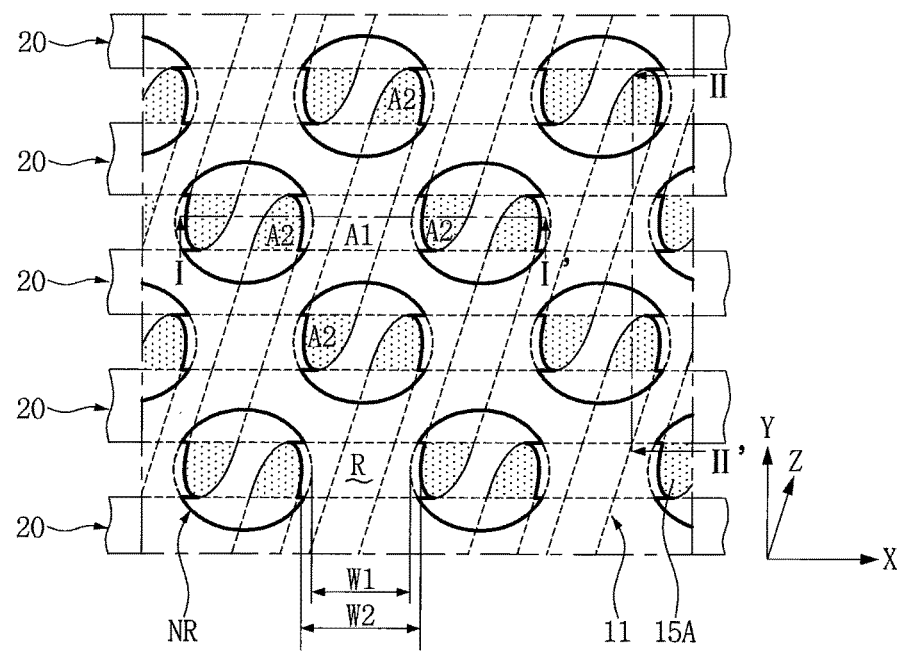
Figure 10B:
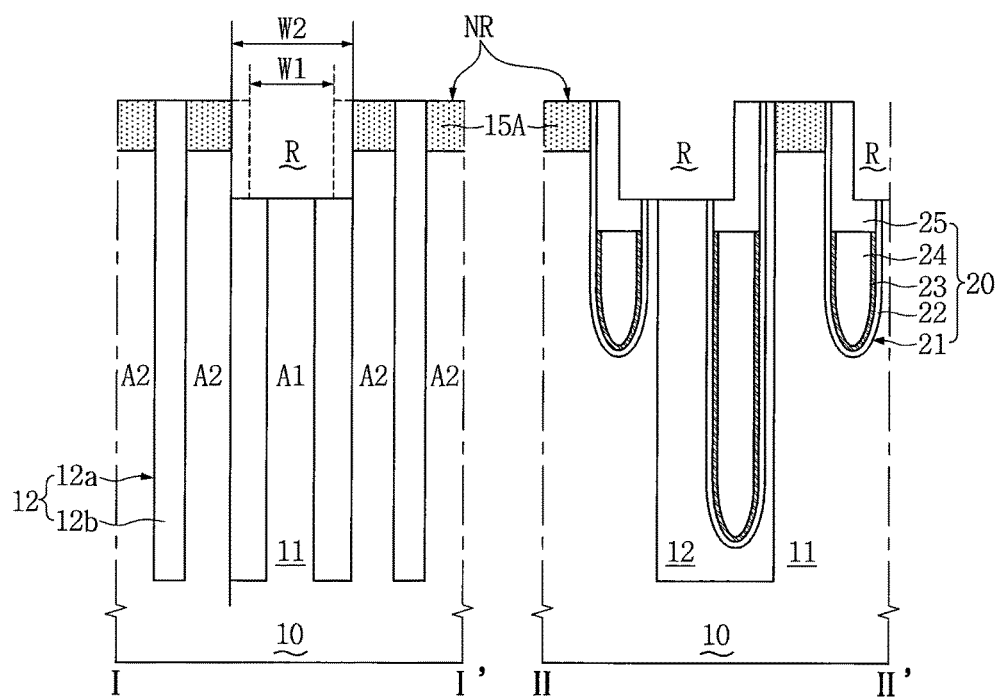

Referring to FIGS. 10A and 10B, the method may include expanding the recess region R by performing an etching process. Specifically, the recess region R may be expanded in a width direction, for example, in the X-axis direction in a plan view. For example, the recess region R may be expanded by etching the device isolation region 12 that is located at both of the sides of the center portion A1 of the active regions 11 by performing an etching process. In some embodiments, the recess region R may be expanded in the X direction and may not be expanded in the Y direction in a plan view.

In other words, the gate capping insulating pattern 25 of the gate structures 20 may be exposed in the Y-axis direction of the recess region R, and the device isolation region 12 may be exposed in the X-axis direction of the recess region R. Also, the gate capping insulating pattern 25 may include silicon nitride, and the device isolation region 12 may include silicon oxide. Accordingly, the gate capping insulating pattern 25 that is exposed in the Y-axis direction of the recess region R may not be etched, and only the device isolation region 12 that is exposed in the X-axis direction of the recess region R may be etched. As a result, the X-axis width W2 of the expanded recess region R may be greater than the X-axis width W1 of the previous recess region R.

Meanwhile, the second mask patterns M2 may be simultaneously removed while the recess region R is expanded. Also, the active buffer patterns 15A on both of the end portions A2 of the active regions 11 may serve as a mask in a etching process for expanding the recess region R.

Figure 11A:
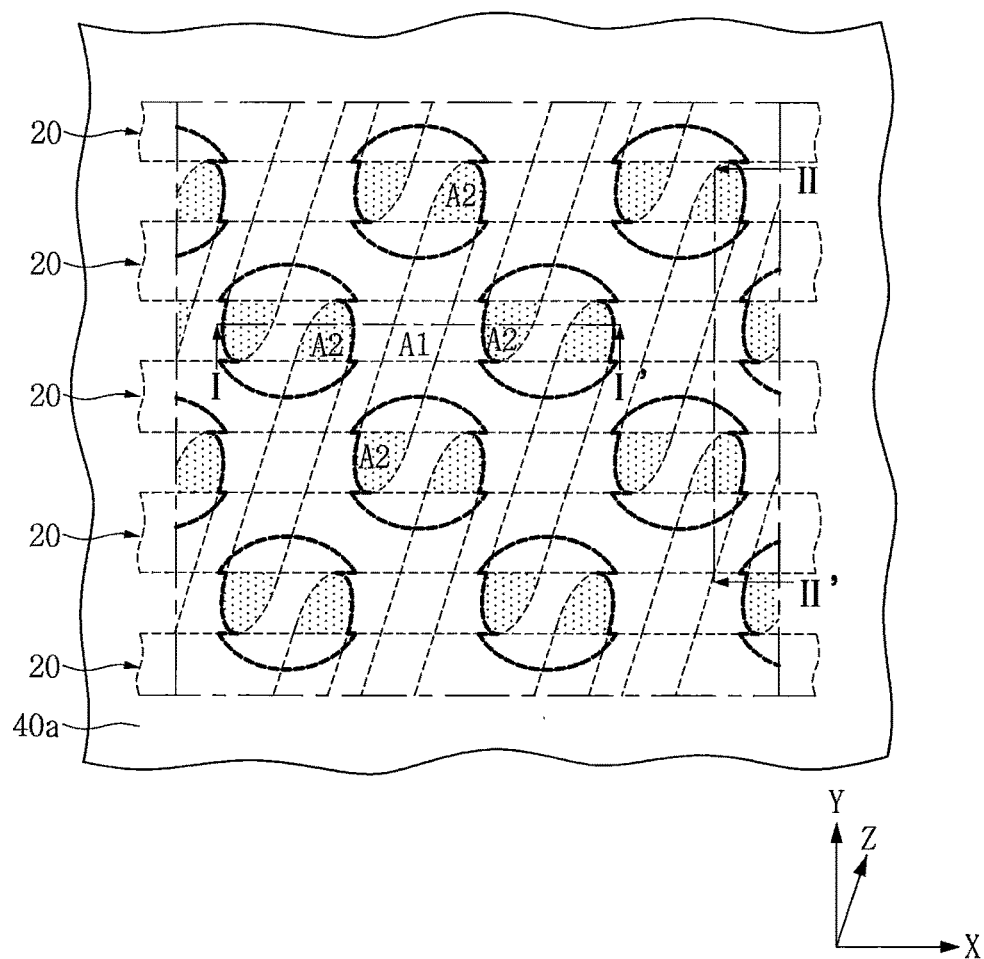
Figure 11B:
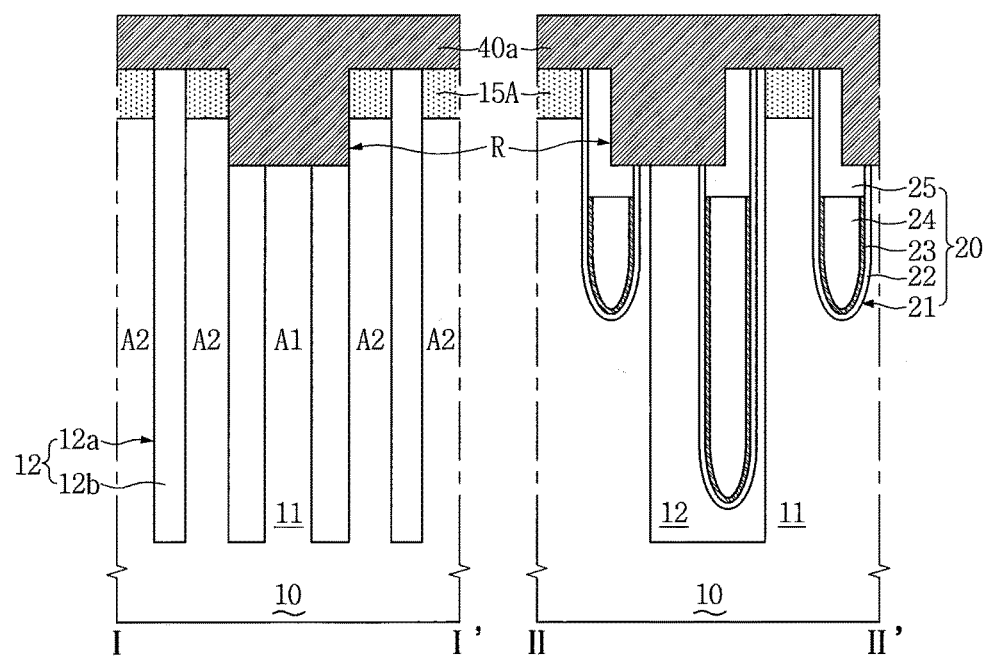

Referring to FIGS. 11A and 11B, the method may include forming a bit-line contact plug layer 40a in, and in some embodiments filling, the expanded recess region R on the substrate 10 by performing a deposition process. The bit-line contact plug layer 40a may include polysilicon.

Figure 12A:
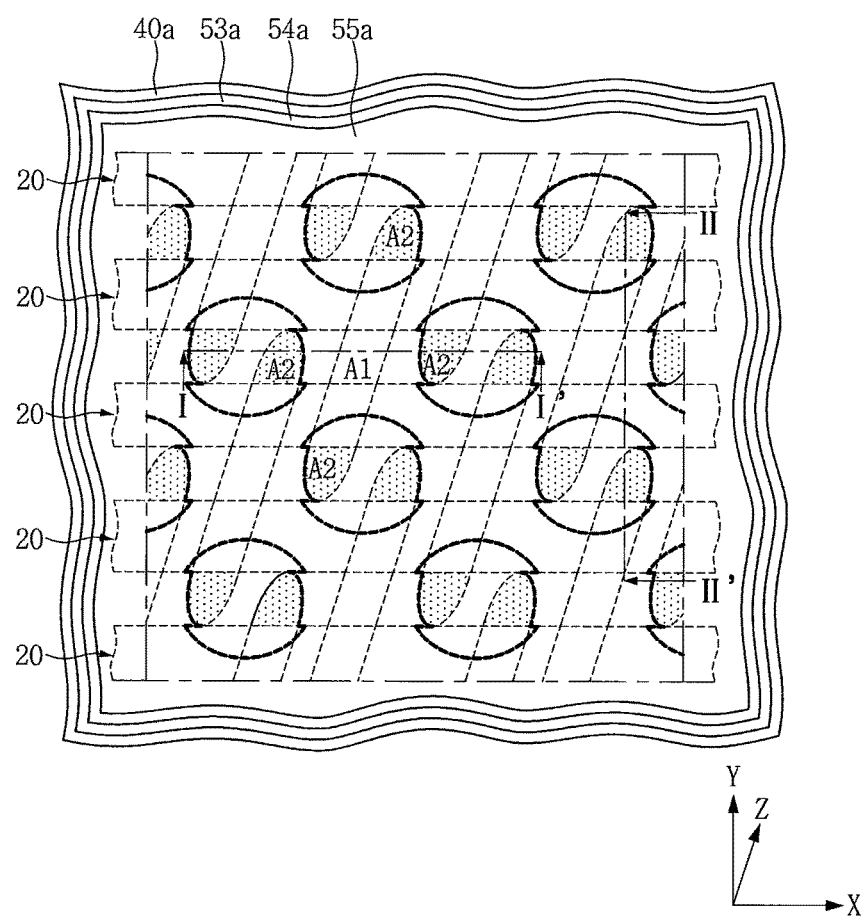
Figure 12B:
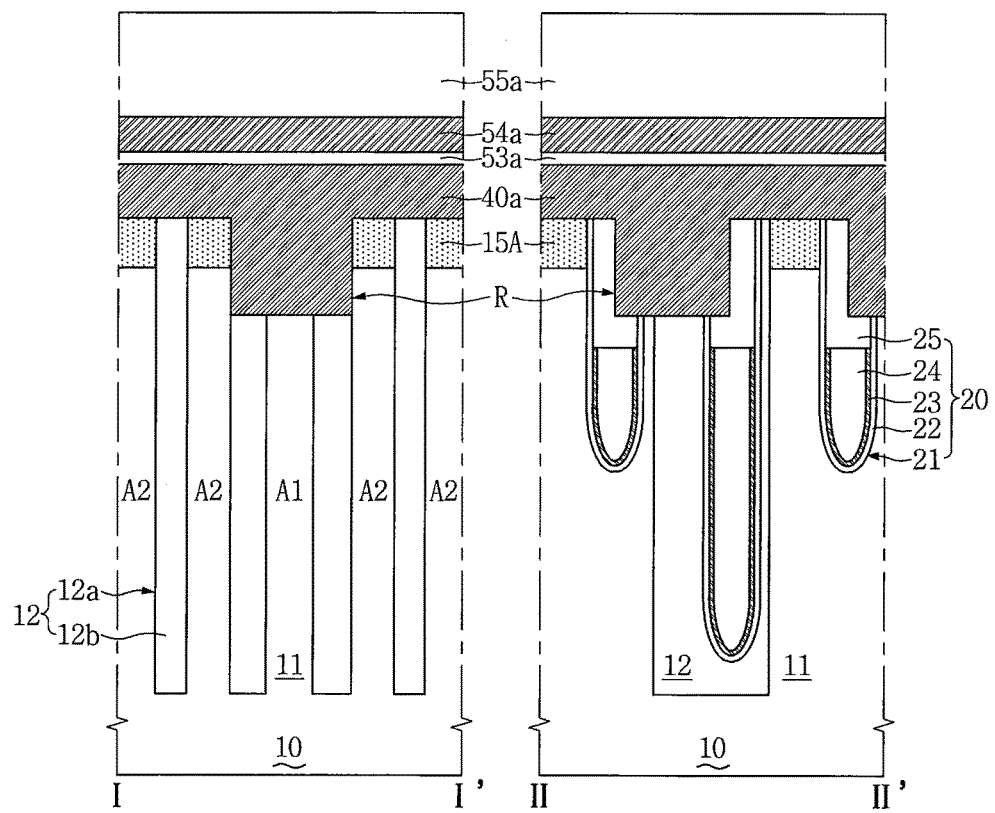

Referring to FIGS. 12A and 12B, the method may include sequentially forming a bit-line barrier layer 53a, a bit-line electrode layer 54a, and a bit-line capping layer 55a on the bit-line contact plug layer 40a by performing a deposition process. The bit-line barrier layer 53a may include a metal and/or a metal compound such as titanium (Ti), titanium nitride (TiN), titanium silicide (TiSi), tantalum (Ta), tantalum nitride (TaN), tantalum silicide (TaSi), nickel silicide (NiSi), cobalt silicide (CoSi), tungsten nitride (WN) and/or tungsten silicide (WSi). The bit-line electrode layer 54a may include a metal such as tungsten and/or copper. The bit-line capping layer 55a may include silicon nitride.

Figure 13A:
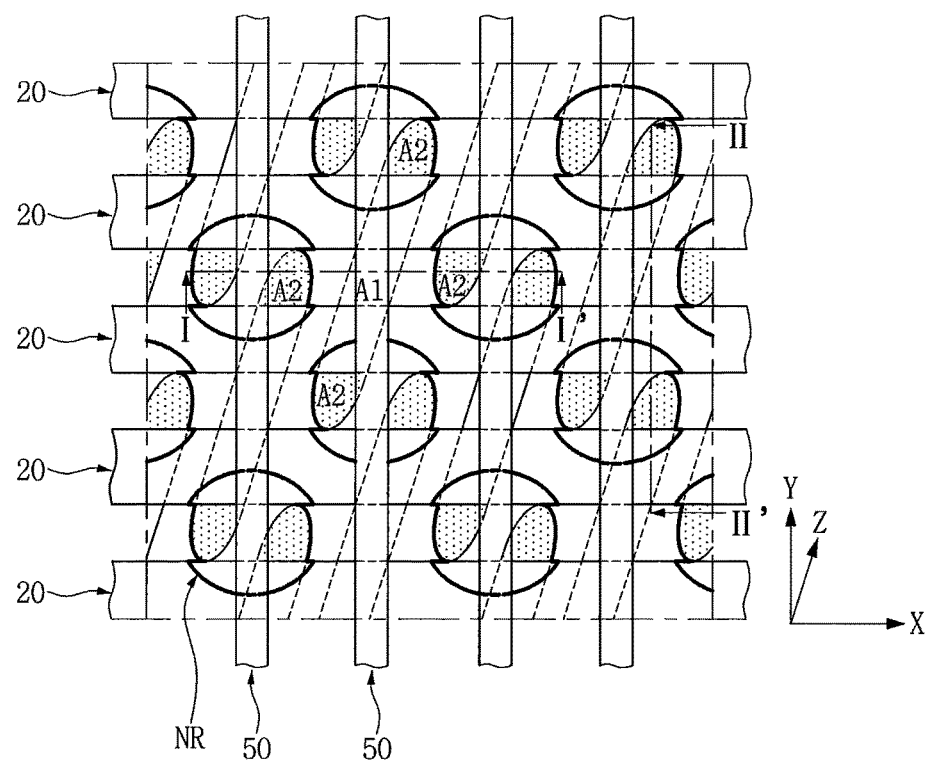
Figure 13B:
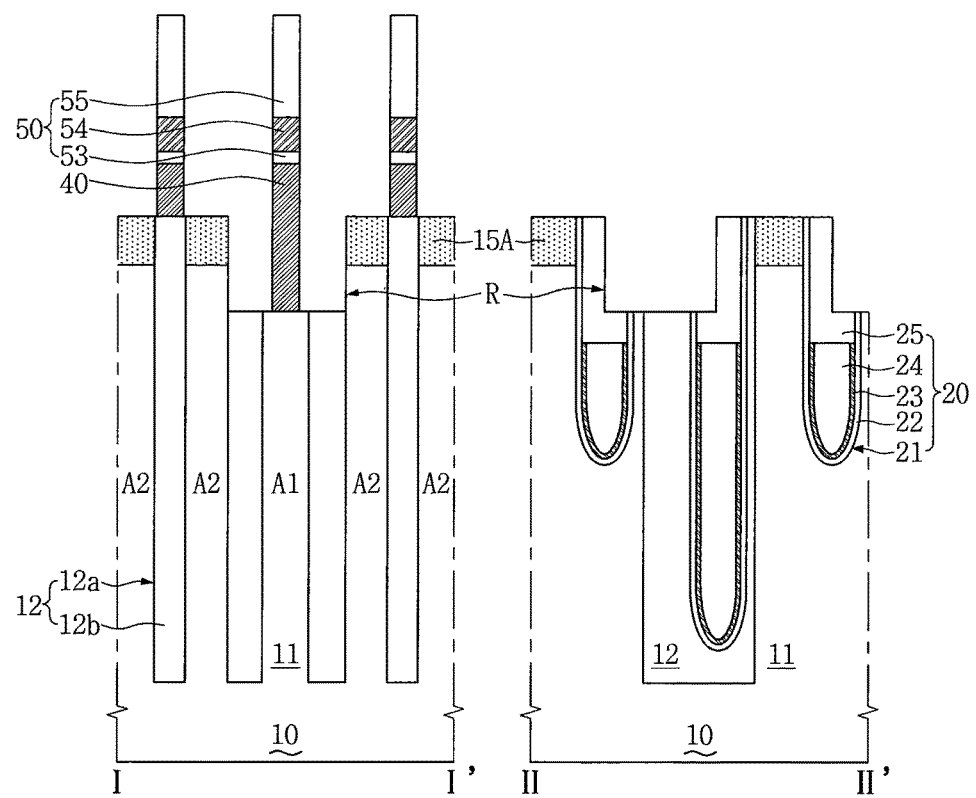

Referring to FIGS. 13A and 13B, the method may include forming bit-line structures 50 including a bit-line barrier pattern 53, a bit-line electrode pattern 54, and a bit-line capping pattern 55 and bit-line contact plugs 40 by etching the bit-line capping layer 55a, the bit-line electrode layer 54a, the bit-line barrier layer 53a, and the bit-line contact plug layer 40a by performing an etching process. Side surfaces of the bit-line capping pattern 55, the bit-line electrode pattern 54, the bit-line barrier pattern 53, and the bit-line contact plug 40 may be vertically aligned. At this time, as above described, because the recess region R which exposes the center portion A1 of the active regions 11 is expanded in the X-axis direction, the bit-line contact plug layer 40a may be etched easily. Accordingly, after etching the bit-line contact plug layer 40a, little or no conductive residue between the bit-line contact plug 40 and sidewalls of both of the end portions A2 of the active regions 11 in the expanded recess region R may be present.

Figure 14A:
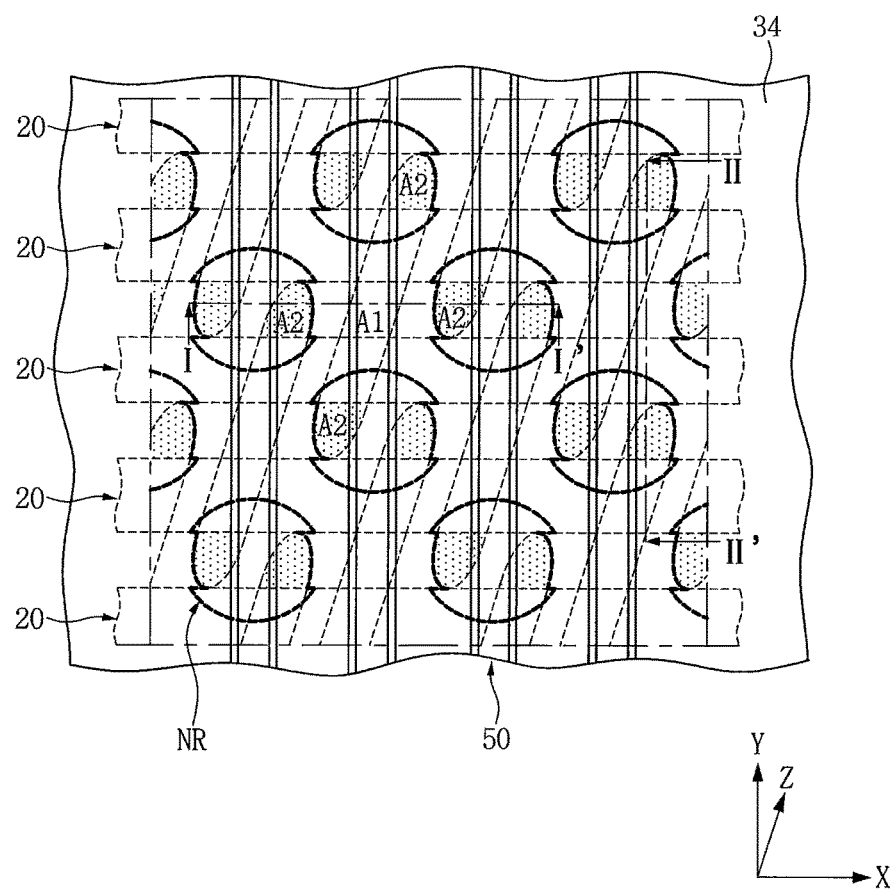
Figure 14B:
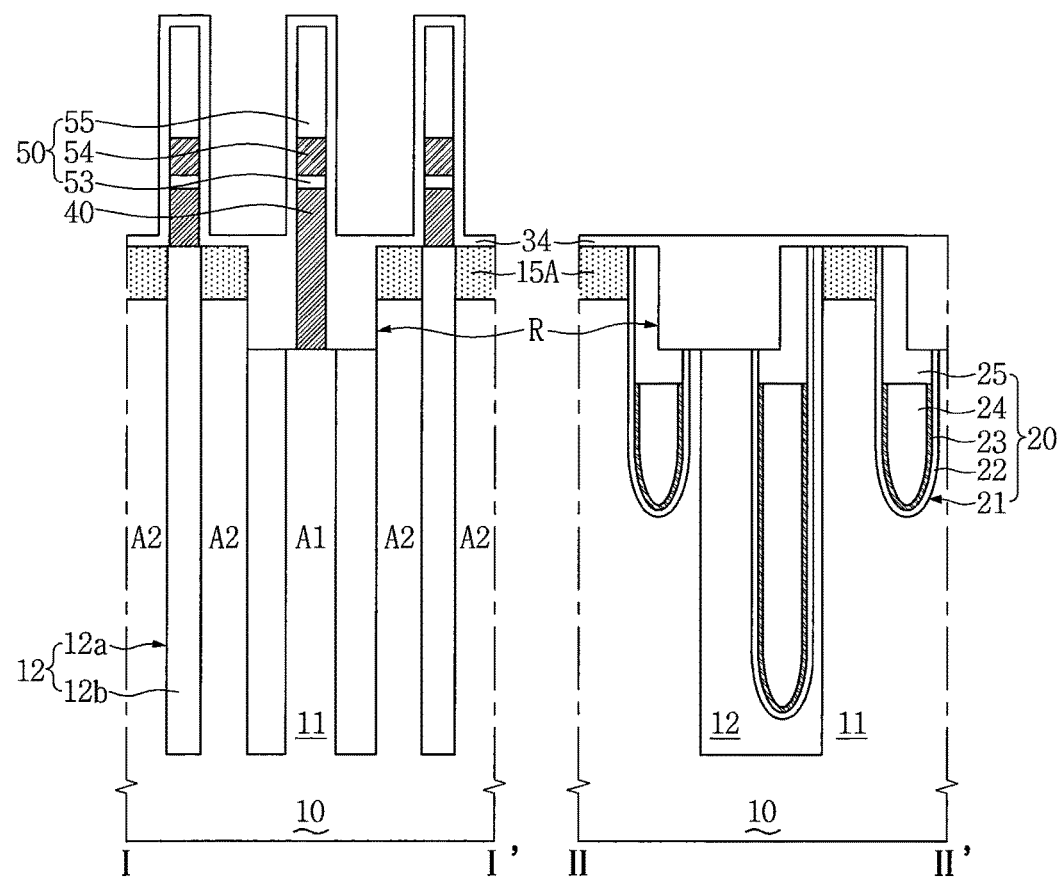

Referring to FIGS. 14A and 14B, the method may include forming a spacer layer 34 surrounding the bit-line structures 50 and the bit-line contact plugs 40. The spacer layer 34 may be formed by performing an ALD process and/or a CVD process. The spacer layer 34 may be in, and in some embodiments may fill, the expanded recess region R. The spacer layer 34 may include silicon nitride.

Figure 15A:
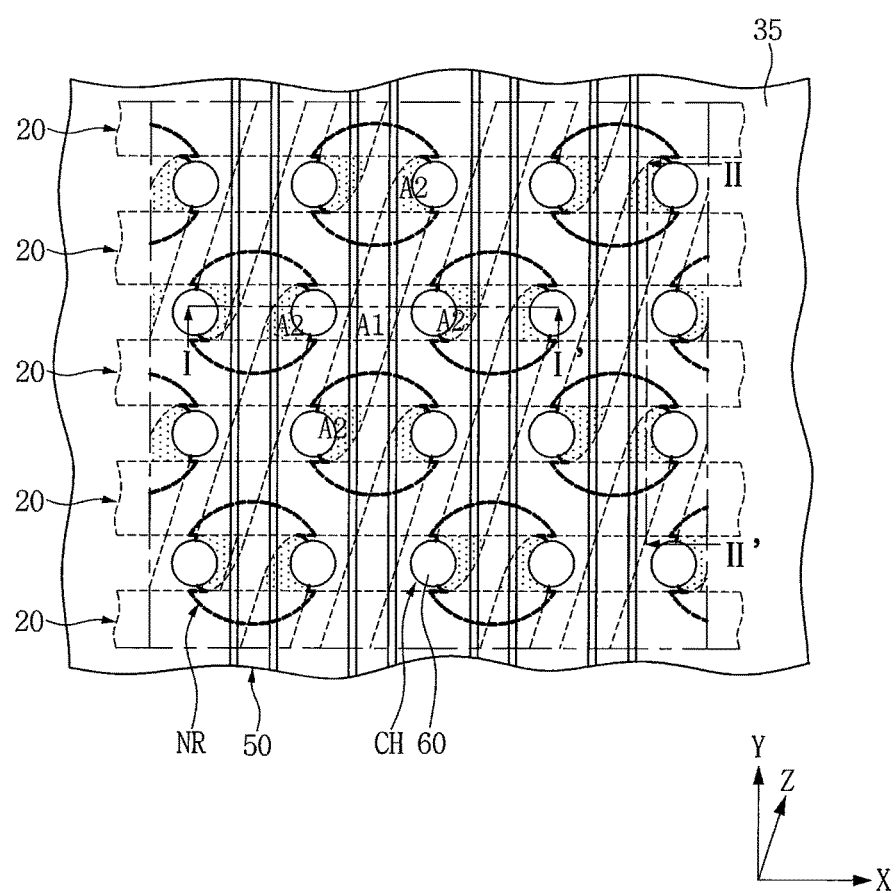
Figure 15B:
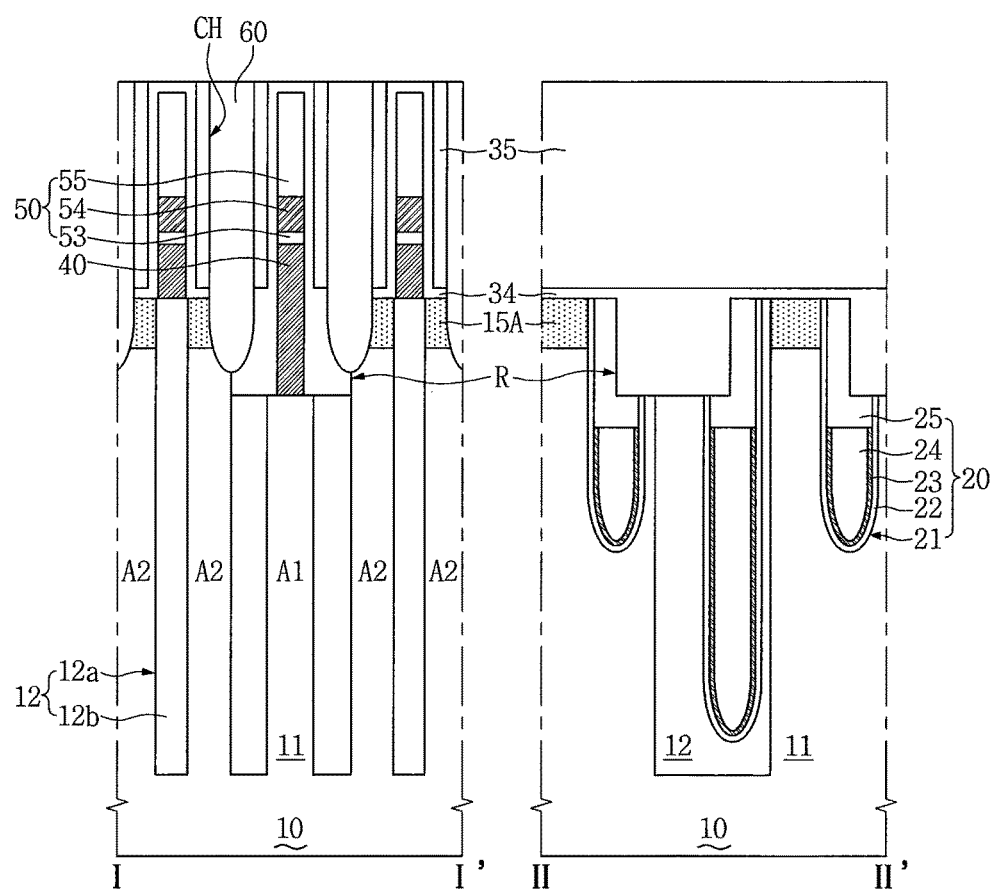

Referring to FIGS. 15A and 15B, the method may include forming an interlayer insulating layer 35 on the spacer layer 34, forming capacitor contact holes CH by etching the interlayer insulating layer 35 and the spacer layer 34, and forming capacitor contact plugs 60 in, and in some embodiments filling, the capacitor contact holes CH.

The interlayer insulating layer 35 may be formed by a deposition process. The interlayer insulating layer 35 may include silicon oxide. Before the capacitor contact holes CH are formed, a CMP process for planarizing the interlayer insulating layer 35 may be performed.

The capacitor contact holes CH may be connected to both of the end portions A2 of the active regions 11. For example, parts of upper ends of both of the end portions A2 of the active regions 11 and parts of the active buffer patterns 15A on both of the end portions A2 of the active regions 11 may be recessed by forming the capacitor holes CH. Bottom surfaces of the capacitor contact holes CH may be at a level lower than the upper surfaces of both of the end portions of the active regions 11. Accordingly, the capacitor contact plugs 60 in the capacitor contact holes CH may be in contact with both of the end portions A2 of the active regions 11. At this time, as described above, because the recess region is expanded, little or no conductive residue between the bit-line contact plug 40 and the sidewalls of both of the end portions A2 of the active regions 11 in the expanded recess region R may be generated. Accordingly, a problem that causes a short circuit between the capacitor contact plugs 60 and the bit-line contact plugs 40 may be reduced or prevented.

The method may further include performing a planarization process such as a CMP process in order for upper surfaces of the capacitor contact plugs 60 to be coplanar with an upper surface of the spacer layer 34. The capacitor contact plugs 60 may include doped polysilicon, a metal, a metal silicide and/or a metal compound.

Referring to FIG. 2A, the method may include forming capacitor structures 80 on the capacitor contact plugs 60 and the spacer layer 34. The forming of the capacitor structures 80 may include the following processes.

First, the processes may include forming an etch stop layer 36 on the capacitor contact plugs 60 and the spacer layer 34, forming a molding oxide layer on the etch stop layer 36, and forming capacitor electrode holes vertically passing through the molding oxide layer and the etch stop layer 36 to expose the upper surface of the capacitor contact plugs 60. The etch stop layer 36 and the molding oxide layer may be formed by performing a deposition process. The etch stop layer 36 may include silicon nitride. The molding oxide layer may include silicon oxide.

Next, the processes may include forming capacitor lower electrodes 81 in, and in some embodiments filling, the capacitor electrode holes, and removing the molding oxide layer. The capacitor lower electrodes 81 may be formed by performing an ALD process and/or a CVD process. The capacitor lower electrodes 81 may include doped polysilicon, a metal and/or a metal silicide.

Next, the processes may include conformally forming a capacitor dielectric layer 83 on surfaces of the capacitor lower electrodes 81 and conformally forming a capacitor upper electrode 85 on the capacitor dielectric layer 83. The capacitor dielectric layer 83 and the capacitor upper electrode 85 may be formed by performing an ALD process. The capacitor dielectric layer 83 may include a metal oxide such as hafnium oxide, aluminum oxide, titanium oxide, tantalum oxide, ruthenium oxide, or lanthanum oxide, silicon oxide and/or silicon nitride. The capacitor upper electrode 85 may include a metal and/or a metal compound.

Next, the processes may include forming a capacitor capping insulating layer 38 in, and in some embodiments filling, gaps between the capacitor structures 80 and on, and in some embodiments covering, the capacitor structures 80 on the capacitor upper electrode 85. The capacitor capping insulating layer 38 may be formed by performing a CVD process. The capacitor capping insulating layer 38 may include silicon oxide.

FIGS. 16 to 25 are vertical cross-sectional views taken along line I-I' of FIG. 1 for describing a method of fabricating a semiconductor device 100B in accordance with embodiments of the inventive concepts. In these embodiments, detailed description of the same content as in the above-described embodiments will be omitted.

First, referring to FIGS. 3A to 4, a method of fabricating a semiconductor device 100B in accordance with embodiments of the inventive concepts may include forming a device isolation region 12 defining active regions 11 in a substrate 10 and recessing upper portions of the active regions 11.

Referring to FIG. 16, the method may include forming sacrificial patterns 115 on the recessed active regions 11 by performing a deposition process. The sacrificial patterns 115 may include silicon-germanium SiGe.

Referring to FIG. 17, the method may include forming third mask patterns M3 on the substrate 10 to expose the sacrificial patterns 115 on a center portion A1 of the active regions 11. The third mask patterns M3 may be mask patterns for recessing the center portion A1 of the active regions 11. The third mask patterns M3 may include silicon oxide.

As shown in FIGS. 6A to 7b, the method may further include forming gate structures 20 in the substrate 10 before forming the third mask patterns M3 on the substrate 10.

Referring to FIG. 18, the method may include removing the exposed sacrificial patterns 115 on the center portion A1 of the active regions 11 and forming a recess region R by recessing the center portion A1 of the active regions 11.

Referring to FIG. 19, the method may include expanding the recess region R by performing an etching process. For example, the recess region R may be expanded by etching the device isolation region 12 that is located at both of the sides of the center portion A1 of the active regions 11 that are exposed in the recess region R. Here, the third mask pattern M3 including silicon oxide may be removed at the same time.

Referring to FIG. 20, the method may include forming a lower bit-line contact plug layer 40L in the expanded recess region R. The lower bit-line contact plug layer 40L may include polysilicon. The forming of the lower bit-line contact plug layer 40L may include forming the lower bit-line contact plug layer 40L on the substrate 10 in, and in some embodiments to fill, the expanded recess region R by a deposition process, and removing the lower bit-line contact plug layer 40L on the substrate 10 to expose the sacrificial patterns 115 on both end portions A2 of the active regions 11 by a planarization process. Accordingly, an upper surface of the lower bit-line contact plug layer 40L in, and in some embodiments filling, the expanded recess region R may be coplanar with upper surfaces of the sacrificial patterns 115 on both of the end portions A2 of the active regions 11.

Referring to FIG. 21, the method may include removing the exposed sacrificial patterns 115 on both of the end portions A2 of the active regions 11 by performing an etching process.

Figure 22:
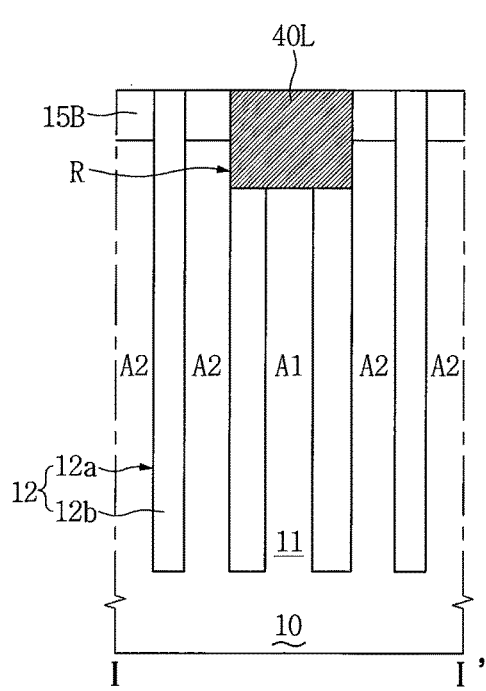

Referring to FIG. 22, the method may include forming active buffer patterns 15B on both of the end portions A2 of the active regions 11. The forming of the active buffer patterns 15B may include forming an active buffer layer on the substrate 10 by performing a deposition process, and removing the active buffer layer on the substrate 10 to expose an upper surface of the lower bit-line contact plug layer 40L by a planarization process. The active buffer patterns may include silicon oxide.

Figure 23:
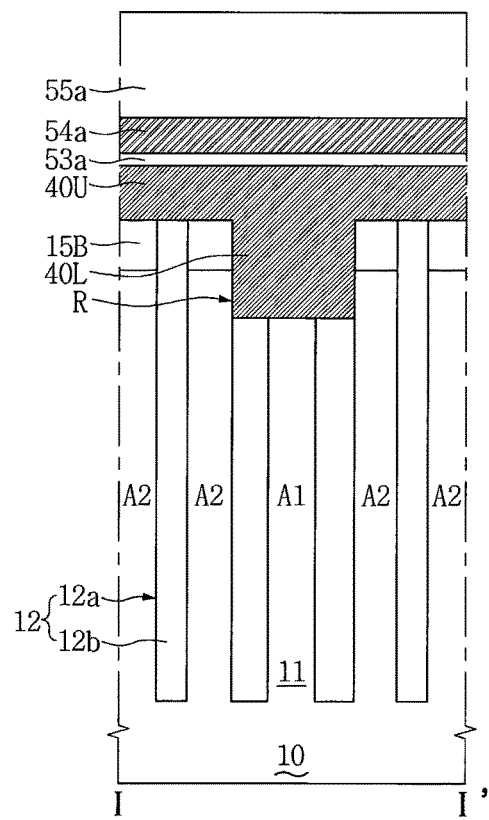

Referring to FIG. 23, the method may include forming an upper bit-line contact plug layer 40U, a bit-line barrier layer 53a, a bit-line electrode layer 54a, and a bit line capping layer 55a on the substrate 10 by performing a deposition process. The upper bit-line contact plug layer 40U may include polysilicon. A boundary between the upper bit-line contact plug layer 40U and the lower bit-line contact plug layer 40L may disappear.

Figure 24:
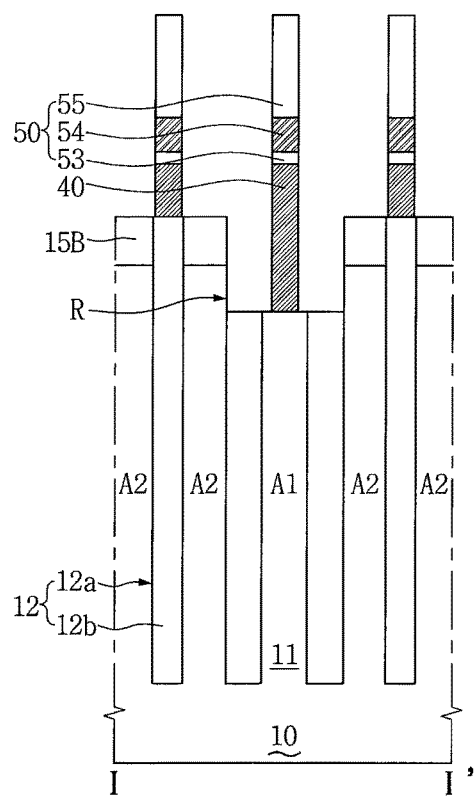

Referring to FIG. 24, the method may include forming bit-line structures 50 including bit-line barrier patterns 53, bit-line electrode patterns 54, bit-line capping patterns 55 and bit-line contact plugs 40 by etching the bit-line capping layer 55a, the bit-line electrode layer 54a, the bit-line barrier layer 53a, the upper bit-line contact plug layer 40U, and the lower bit-line contact plug layer 40L by performing an etching process.

Figure 25:
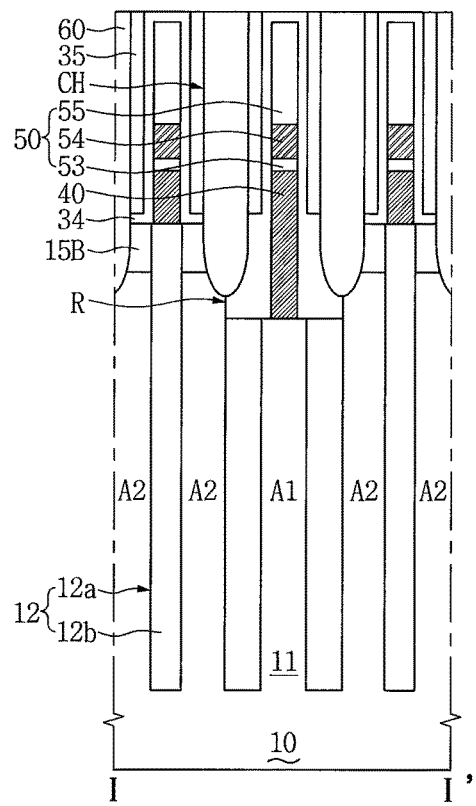

Referring to FIG. 25, the method may include forming a spacer layer 34 surrounding the bit-line structures 50 and the bit-line contact plugs 40, forming interlayer insulating layer 35 on the spacer layer 34, forming capacitor contact holes CH passing through the interlayer insulating layer 35 and the spacer layer 34, and forming capacitor contact plugs 60 in, and in some embodiments filling, the capacitor contact holes CH.

Referring to FIG. 2B, the method may include forming capacitor structures 80 on the capacitor contact plugs 60 and the spacer layer 34.

FIGS. 26 to 29 are vertical cross-sectional views taken along line I-I' of FIG. 1 for describing a method of fabricating a semiconductor device 100C in accordance with embodiments of the inventive concepts. In these embodiments, detailed description of the same content as in the above-described embodiments will be omitted.

First, referring to FIGS. 3A to 4, a method of fabricating a semiconductor device 100C in accordance with embodiments of the inventive concepts may include forming a device isolation region 12 defining active regions 11 in a substrate 10 and recessing upper portions of the active regions 11.

Next, referring to FIGS. 16 to 21, the method may include forming sacrificial patterns 115 on the recessed active regions 11, forming the third mask patterns M3 on the substrate 10 to expose the sacrificial patterns 115 on a center portion A1 of the active regions 11, removing the exposed sacrificial patterns 115 on the center portion A1 of the active regions 11, forming a recess region R by etching the center portion A1 of the active regions 11, expanding the recess region R by performing an etching process, forming a lower bit-line contact plug layer 40L in the expanded recess region R, and removing the sacrificial patterns 115 on both of the end portions A2 of the active regions 11.

Figure 26:
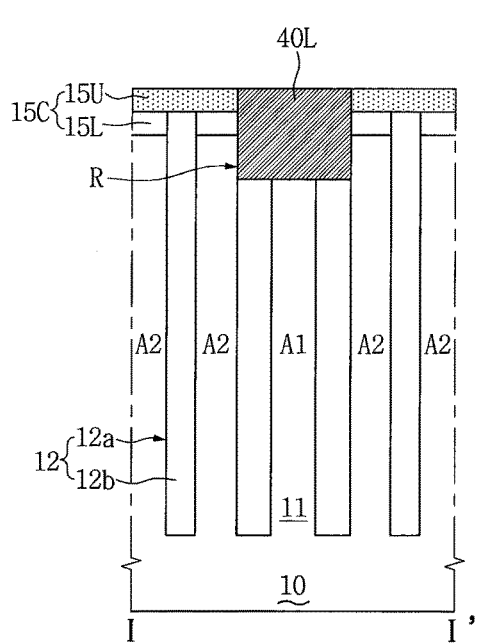

Referring to FIG. 26, the method may include forming active buffer patterns 15C on both of the end portions A2 of the active regions 11. Each of the active buffer patterns 15C may include lower active buffer patterns 15L on both of the end portions A2 of the active regions 11 and upper active buffer pattern 15U on the lower active buffer patterns 15L and the device isolation region 12 between the lower active buffer patterns 15L.

For example, the forming of the active buffer patterns 15C may include forming a lower active buffer layer on both of the recessed end portions A2 of the active regions 11 and the lower bit-line contact plug layer 40L by performing a deposition process, and forming the lower active buffer patterns 15L having upper surfaces lower than an upper surface of the lower bit-line contact plug layer 40L by performing an etch-back process. At this time, the device isolation region 12 between the end portions A2 of two adjacent active regions 11 may be also etched. Accordingly, upper surfaces of adjacent lower active buffer patterns 15L may be coplanar with an upper surface of the device isolation region 12 between the adjacent lower active buffer patterns 15L.

Also, the forming of the active buffer patterns 15C may further include forming an upper active buffer layer on the lower active buffer patterns 15L, the device isolation region 12 between the lower active buffer patterns 15L and the lower bit-line contact plug layer 40L by performing a deposition process, and forming upper active buffer patterns 15U by removing the upper active buffer layer on the substrate 10 to expose a surface of the lower bit-line contact plug layer 40L by performing a planarization process. Accordingly, upper surfaces of the upper active buffer patterns 15U may be coplanar with an upper surface of the lower bit-line contact plug layer 40L. The lower active buffer patterns 15L may include silicon oxide. The upper active buffer patterns 15U may include silicon nitride.

Figure 27:
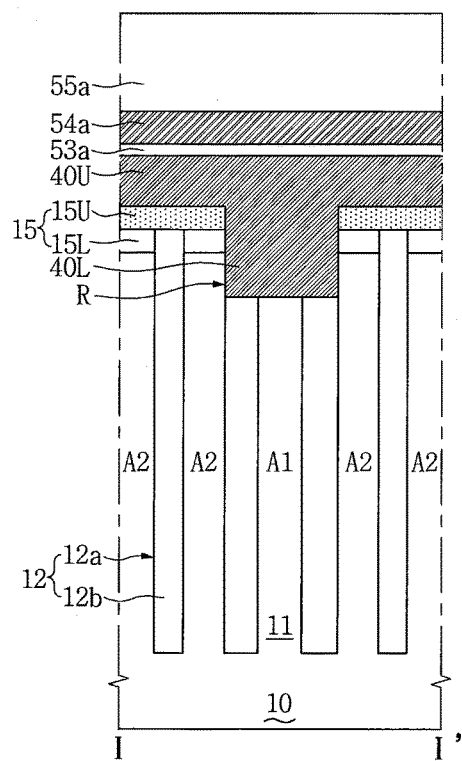

Referring to FIG. 27, the method may include forming an upper bit-line contact plug layer 40U, a bit-line barrier layer 53a, a bit-line electrode layer 54a, and a bit line capping layer 55a on the substrate 10 by performing a deposition process.

Referring to FIG. 28, the method may include forming bit-line structures 50 including bit-line barrier patterns 53, bit-line electrode patterns 54, and bit-line capping patterns 55 and bit-line contact plugs 40 by etching the bit-line capping layer 55a, the bit-line electrode layer 54a, the bit-line barrier layer 53a, the upper bit-line contact plug layer 40U, and the lower bit-line contact plug layer 40L by performing an etching process.

Referring to FIG. 29, the method may include forming a spacer layer 34 surrounding the bit-line structures 50 and the bit-line contact plugs 40, forming interlayer insulating layer 35 on the spacer layer 34, forming capacitor contact holes CH passing through the interlayer insulating layer 35 and the spacer layer 34, and forming capacitor contact plugs 60 in, and in some embodiments filling, the capacitor contact holes CH.

Referring to FIG. 2C, the method may include forming capacitor structures 80 on the capacitor contact plugs 60 and the spacer layer 34.

FIGS. 30 to 40 are vertical cross-sectional views taken along line I-I' of FIG. 1 for describing a method of fabricating a semiconductor device 100D in accordance with embodiments of the inventive concepts. In these embodiments, detailed description of the same content as in the above-described embodiments will be omitted.

Figure 30:
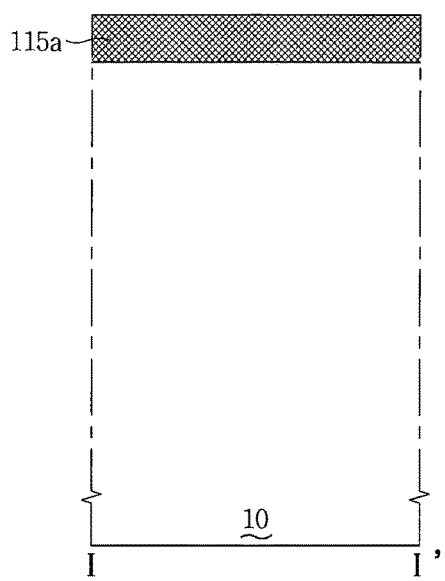

Referring to FIG. 30, a method of fabricating a semiconductor device 100D in accordance with embodiments of the inventive concepts may include forming a sacrificial layer 115a on a substrate 10. The sacrificial layer 115a may include silicon-germanium SiGe.

Figure 31:
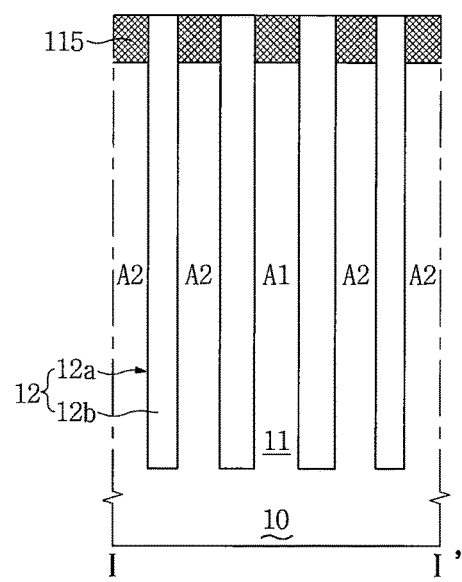

Referring to FIG. 31, the method may include forming a device isolation region 12 defining active regions 11 in the substrate 10 passing through the sacrificial layer 115a. Accordingly, sacrificial patterns 115 may be formed on the active regions 11.

Figure 32:
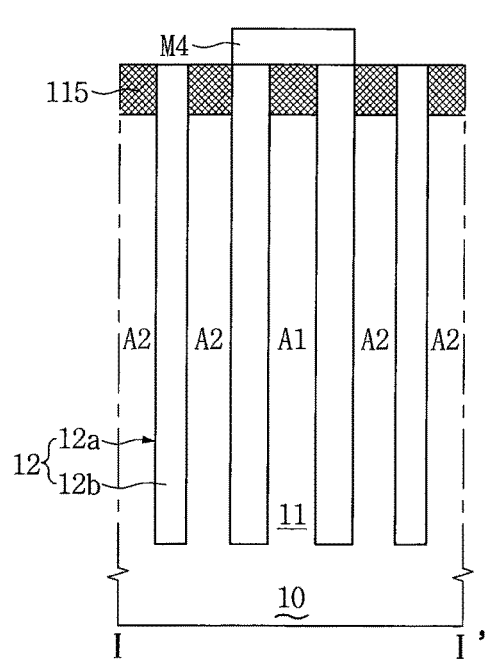

Referring to FIG. 32, the method may include forming fourth mask patterns M4 exposing the sacrificial patterns 115 on both of the end portions A2 of the active regions 11 on the device isolation region 12 and the sacrificial patterns 115. The fourth mask patterns M4 may be mask patterns for recessing both of the end portions A2 of the active regions 11 and the device isolation region 12 between the end portions A2 of the active regions 11. For example, the fourth mask patterns M4 may be on, and in some embodiments cover, a center portion A1 of the active regions 11 and the device isolation region 12 is located at both sides of the center portion A1, and expose both of the end portions A2 of the active regions 11 and the device isolation region 12 between the end portions A2. The fourth mask patterns M4 may include silicon oxide.

Figure 33:
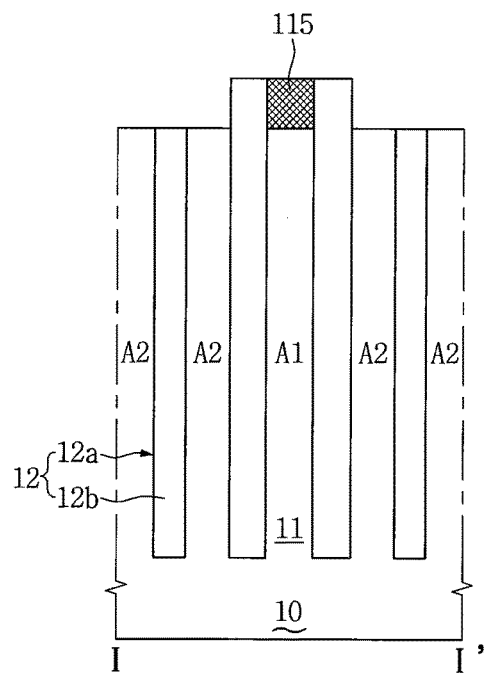

Referring to FIG. 33, the method may include removing the exposed sacrificial patterns 115 on both of the end portions A2 of the active regions 11, and recessing the device isolation region 12 between the end portions A2 of the active regions 11. At this time, the fourth mask patterns M4 may be removed at the same time. Accordingly, upper surfaces of the sacrificial patterns 115 on the center portion of the active regions 11 and the upper surface of the device isolation region 12 is located at both sides of the center portion A1 of the active regions 11 may be exposed. Upper surfaces of both of the recessed end portions A2 of the active regions 11 may be coplanar with the upper surface of the device isolation region 12 between the end portions A2 of the active regions 11.

Figure 34:
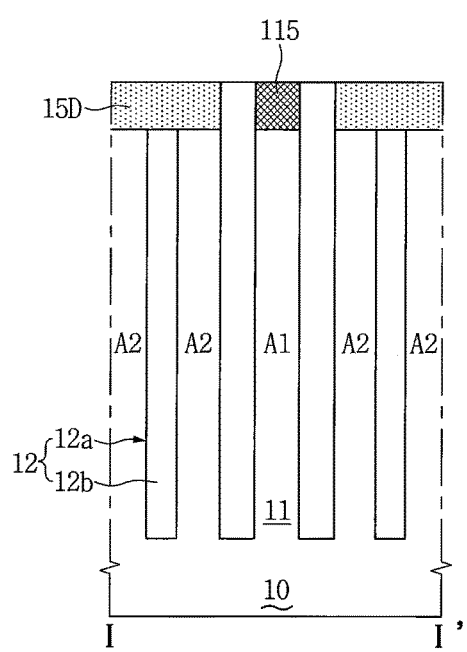

Referring to FIG. 34, the method may include forming active buffer patterns 15D on both of the end portions A2 of the active regions 11 and the device isolation region 12 between the end portions A2 of the active regions 11. Upper surfaces of the active buffer patterns 15D may be coplanar with the upper surfaces of the sacrificial patterns 115 on the center portion A1 of the active regions 11 and the upper surface of the device isolation region 12 is located at both sides of the center portion of the active regions 11. The active buffer patterns 15D may include silicon nitride.

Figure 35:
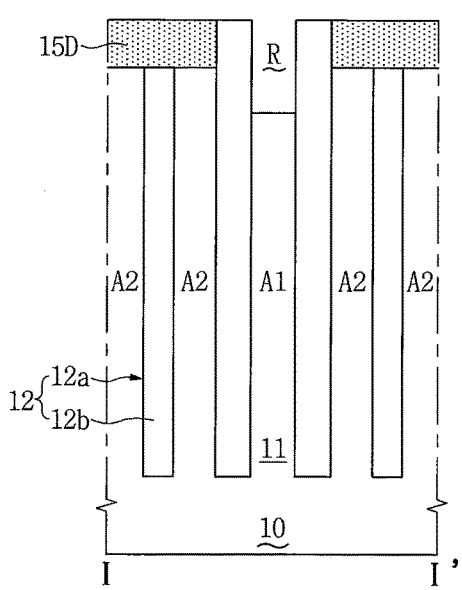

Referring to FIG. 35, the method may include removing the exposed sacrificial patterns 115 on the center portion A1 of the active regions 11 and forming a recess region R by etching the center portion A1 of the active regions 11.

Referring to FIG. 36, the method may include expanding the recess region R by performing an etching process. For example, the recess region R may be expanded by etching the device isolation region 12 that is located at both sides of the center portion A1 of the active regions 11 that is exposed in the recess region R in the width direction. At this time, the device isolation region 12 between the end portions A1 of the active regions 11 may be protected by the active buffer patterns 15D.

Referring to FIG. 37, the method may include forming a lower bit-line contact plug layer 40L in the expanded recess region R.

Figure 38:
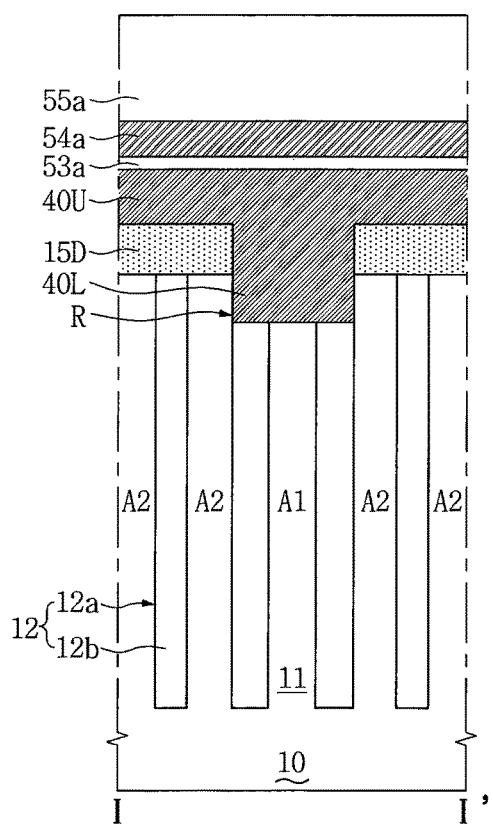

Referring to FIG. 38, the method may include forming an upper bit-line contact plug layer 40U, a bit-line barrier layer 53a, bit-line electrode layer 54a, and a bit-line capping layer 55a on the lower bit-line contact plug layer 40L and the active buffer patterns 15D by performing a deposition process.

Figure 39:
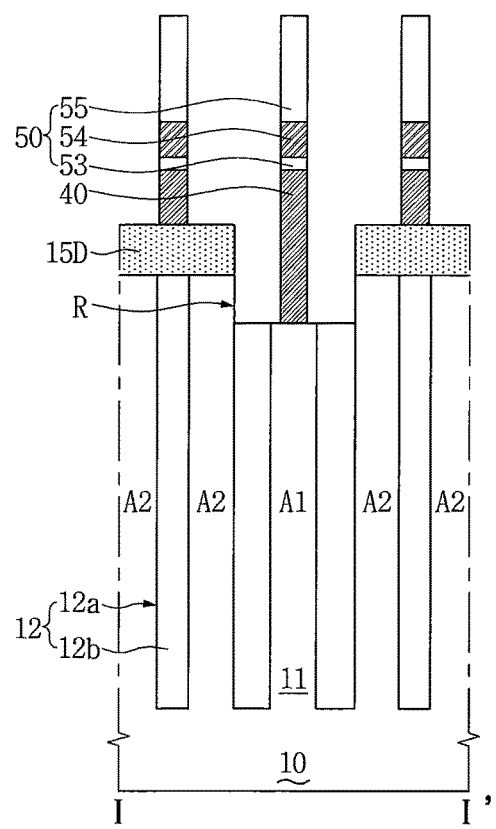

Referring to FIG. 39, the method may include forming bit-line structures 50 including bit-line barrier patterns 53, bit-line electrode patterns 54, and bit-line capping patterns 55 and bit-line contact plugs 40 by etching the bit-line capping layer 55a, the bit-line electrode layer 54a, the bit-line barrier layer 53a, the upper bit-line contact plug layer 40U, and the lower bit-line contact plug layer 40L by performing an etching process.

Figure 40:
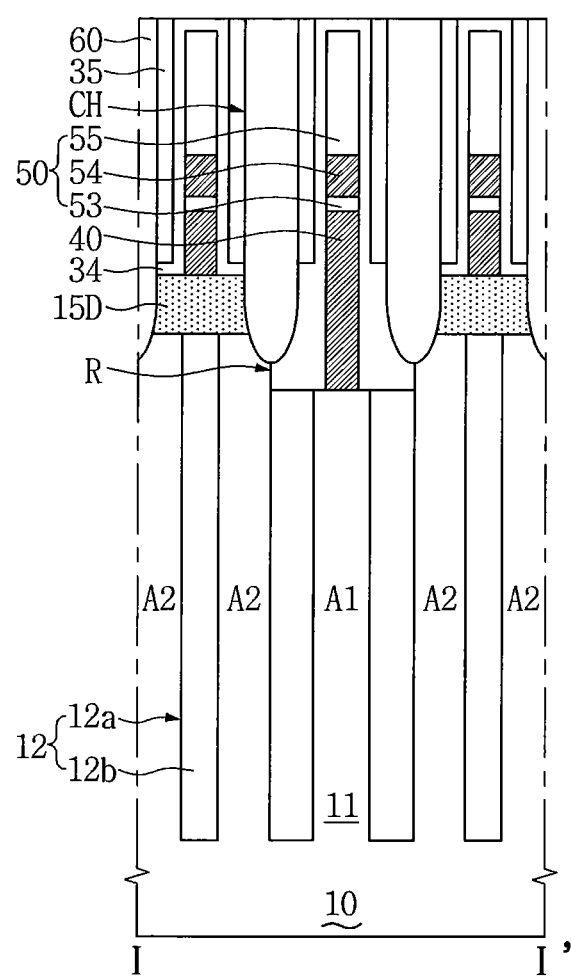

Referring to FIG. 40, the method may include forming a spacer layer 34 surrounding the bit-line structures 50 and the bit-line contact plugs 40, forming interlayer insulating layer 35 on the spacer layer 34, forming capacitor contact holes CH passing through the interlayer insulating layer 35 and the spacer layer 34, and forming capacitor contact plugs 60 in, and in some embodiments filling, the capacitor contact holes CH.

Referring to FIG. 2D, the method may include forming capacitor structures 80 on the capacitor contact plugs 60 and the spacer layer 34.

FIGS. 41 to 53 are vertical cross-sectional views taken along line I-I' of FIG. 1 for describing a method of fabricating a semiconductor device 100E in accordance with embodiments of the inventive concepts. In these embodiments, detailed description of the same content as in the above-described embodiments will be omitted.

First, referring to FIGS. 3A to 4 and 16, a method of fabricating a semiconductor device 100E in accordance with embodiments of the inventive concepts may include forming a device isolation region 12 defining active regions 11 in a substrate 10, recessing upper portions of the active regions 11, and forming sacrificial patterns 115 on the recessed active regions 11.

In other embodiments of the inventive concepts, referring to FIGS. 30 and 31, a method of fabricating a semiconductor device 100E in accordance with embodiments of the inventive concepts may include forming a sacrificial layer 115a on the substrate 10, and forming a device isolation region 12 passing through the sacrificial layer 115a to define active regions 11 in a substrate 10 and sacrificial patterns 115 on the active regions 11.

Figure 41:
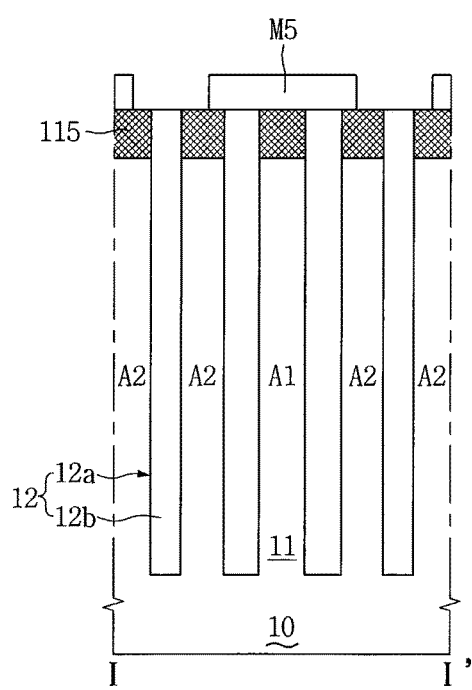

Referring to FIG. 41, the method may include forming fifth mask patterns M5 on the substrate 10 to cover a center portion A1 of the active regions 11 and partially expose both of end portions A2 of the active regions 11. The fifth mask patterns M5 may include silicon oxide.

Figure 42:
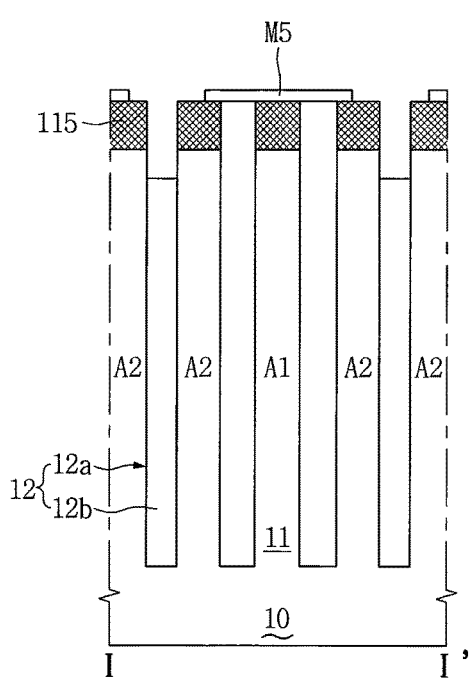

Referring to FIG. 42, the method may include recessing the device isolation region 12 between the end portions A2 of the active regions 11 by performing an etching process using the fifth mask patterns M5 as an etching mask. Here, the fifth mask patterns M5 may be etched at the same time. Accordingly, the fifth mask patterns M5 may be thinned. At this time, an upper surface of the recessed device isolation region 12 may be at a level lower than upper surfaces of the recessed active regions 11.

Referring to FIG. 43, the method may include forming device isolation buffer patterns 16 on the recessed device isolation region 12. Upper surfaces of the device isolation buffer patterns 16 may be coplanar with upper surfaces of the sacrificial patterns 115. The device isolation buffer pattern 16 may include silicon nitride.

Referring to FIG. 44, the method may include removing the sacrificial patterns 115 on both of the end portions of the active regions 11 by performing an etching process. Accordingly, side surfaces of the upper ends of the device isolation region 12 located at both sides of the center portion A1 of the active regions 11 may be exposed.

Figure 45:
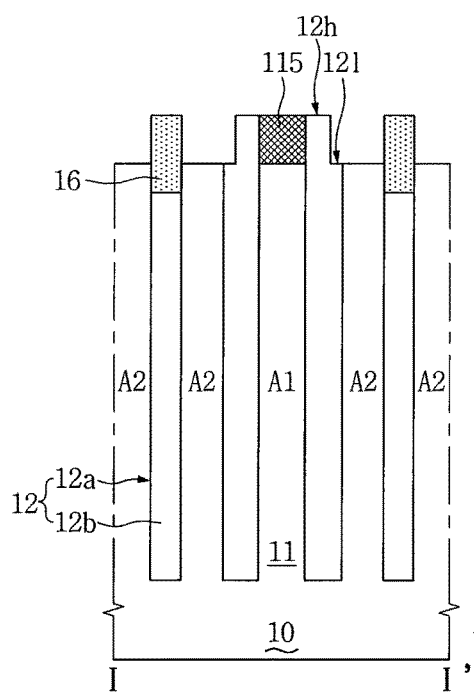

Referring to FIG. 45, the method may include removing the fifth mask patterns M5 by performing an etching process. At this time, because the sacrificial patterns 115 are removed, parts of the exposed side surfaces of the upper end of the device isolation region 12 that is located at both of the sides of the center portion A1 of the active regions 11 may be etched toward the center portion A1 of the active regions 11. Accordingly, an upper end of the device isolation region 12 that is located at both of the sides of the center portion A1 of the active regions 11 may have a step form including a first upper surface 12h of a first level and a second upper surface 12l of a second level lower than the first level. The first upper surface 12h and the second upper surface 12l of the device isolation region 12 located at both sides of the center portion A1 of the active regions 11 may be coplanar with upper surfaces of the center portion of the active regions 11 and upper surfaces of both of the end portions A2 of the active regions 11, respectively.

Figure 46:
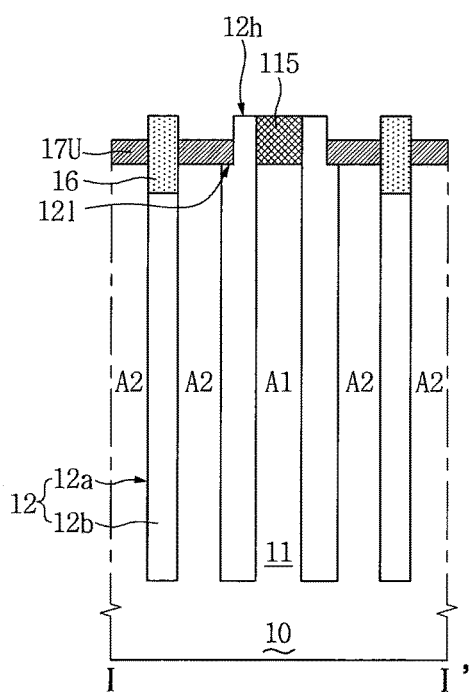

Referring to FIG. 46, the method may include forming upper contact pads 17U on both of the end portions A2 of the active regions 11 and the second upper surface 12l of the device isolation region 12 located at both sides of the center portion A1 of the active regions 11. The upper contact pads 17U may be in contact with capacitor contact plugs 60 that will be described below. A width of the upper contact pads 17U may be greater than a width of both of the end portions A2 of the active regions 11. Accordingly, the upper contact pads 17U may protrude toward the center portion A1 of the active regions 11. A thickness of the upper contact pads 17U may be smaller than a thickness of the sacrificial patterns 115 on the center portion A1 of the active regions 11. Accordingly, upper surfaces of the upper contact pads 17U may be at a level lower than upper surfaces of the sacrificial patterns 115 the device isolation buffer patterns 16. The upper contact pads 17U may include polysilicon.

Referring to FIG. 47, the method may include forming active buffer patterns 15E on the upper contact pads 17U. Upper surfaces of the active buffer pattern 15E may be coplanar with the upper surfaces of the sacrificial patterns 115 and the upper surface of the device isolation buffer patterns 16. The active buffer patterns 15E may include silicon nitride. As a result, a boundary between the active buffer pattern 15E and the device isolation buffer patterns 16 may disappear.

Referring to FIG. 48, the method may include removing the sacrificial patterns 115 on the center portion A1 of the active regions 11 and forming a recess region R by etching the center portion A1 of the active regions 11.

Figure 49:
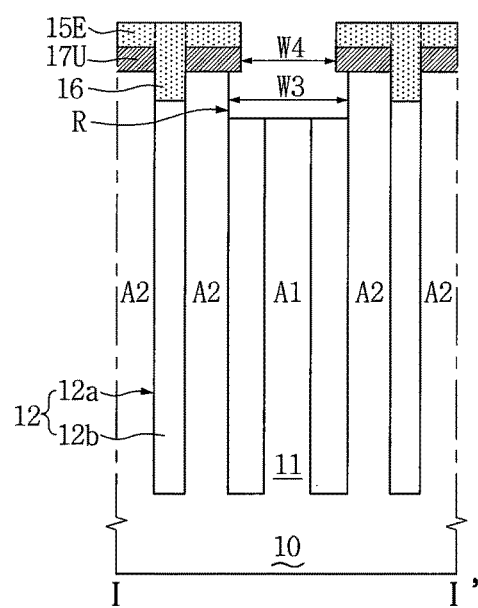

Referring to FIG. 49, the method may include expanding the recess region R by performing an etching process. For example, the recess region R may be expanded by etching the device isolation region 12 located at both sides of the recessed center portion A1 of the active regions 11 in a width direction. At this time, the device isolation region 12 between the end portions A2 of the active regions 11 may be protected by the active buffer patterns 15E and the device isolation buffer patterns 16. The active buffer patterns 15E and the upper contact pads 17U may protrude into the expanded recess region R. As a result, an upper width W4 of the expanded recess region R may be smaller than a lower width W3 of the expanded recess region R.

Figure 50:
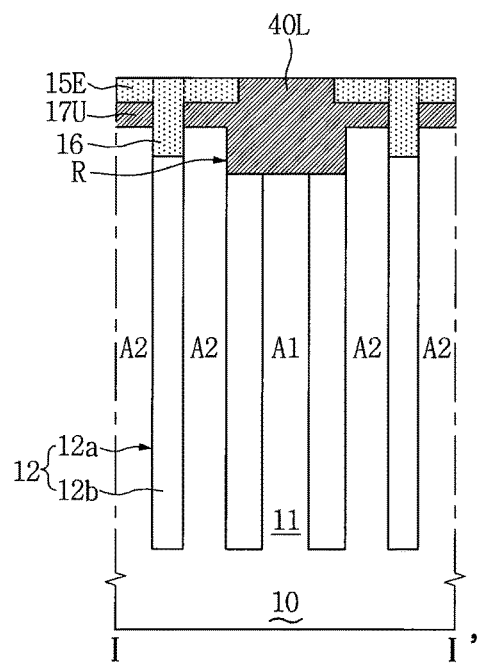

Referring to FIG. 50, the method may include forming a lower bit-line contact plug layer 40L in the expanded recess region R. As shown in FIG. 49, since the upper width W4 of the expanded recess region R is smaller than the lower width W3 of the expanded recess region R, an upper width of the lower bit-line contact plug layer 40L may be smaller than a lower width of the lower bit-line contact plug layer 40L. The lower bit-line contact plug layer 40L may include polysilicon. Accordingly, boundaries (dotted lines) between parts that protrude into the expanded recess region R of the upper contact pads 17U and the lower bit-line contact plug layer 40L may disappear.

Figure 51:
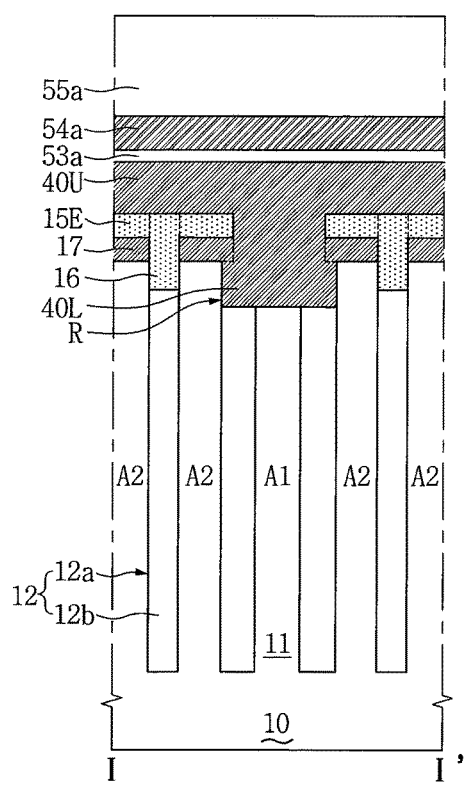

Referring to FIG. 51, the method may include forming an upper bit-line contact plug layer 40U, a bit-line barrier layer 53a, a bit-line electrode layer 54a, and a bit-line capping layer 55a on the lower bit-line contact plug layer 40L, the active buffer patterns 15E and the device isolation buffer patterns 16.

Figure 52:
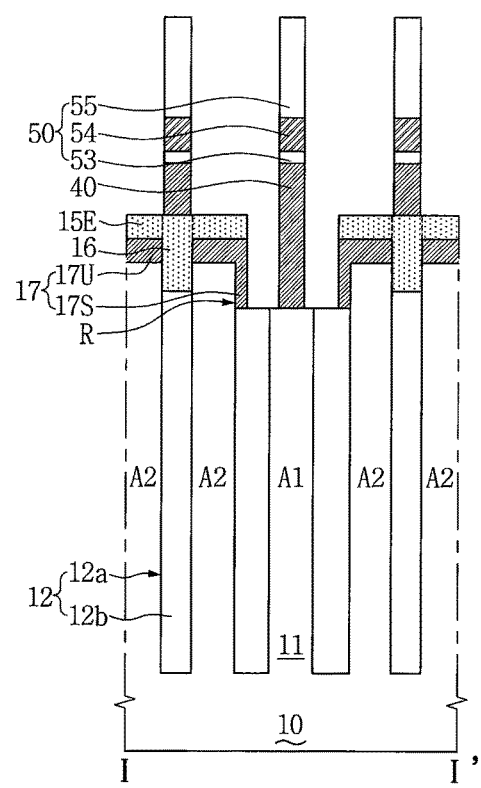

Referring to FIG. 52, the method may include forming bit-line structures 50 including bit-line barrier patterns 53, bit-line electrode patterns 54, and bit-line capping patterns 55 and bit-line contact plugs 40 by etching the bit-line capping layer 55a, the bit-line electrode layer 54a, the bit-line barrier layer 53a, the upper bit-line contact plug layer 40U, and the lower bit-line contact plug layer 40L by performing an etching process. At this time, because the active buffer patterns 15E may protrude into the expanded recess region R, parts of the lower bit-line contact plug layer 40L may remain in the expanded recess region R. For example, the parts of the lower bit-line contact plug layer 40L may remain on sidewalls of the both of end portions A2 of the active regions 11 in the expanded recess region R. The parts of the lower bit-line contact plug layer 40L that remain on the sidewalls of the both of end portions A2 of the active regions 11 in the expanded recess region R may use side contact pads 17S. The side contact pads 17S may be directly on the upper contact pads 17U. Accordingly, the upper contact pads 17U and the side contact pads 17S may use single contact pads 17. As a result, because the contact pads 17 may extend from the upper surfaces of the both of end portions A2 of the active regions 11 to the sidewalls of the both of end portions A2 of the active regions 11, and thus areas of the contact pads 17 may be increased.

Figure 53:
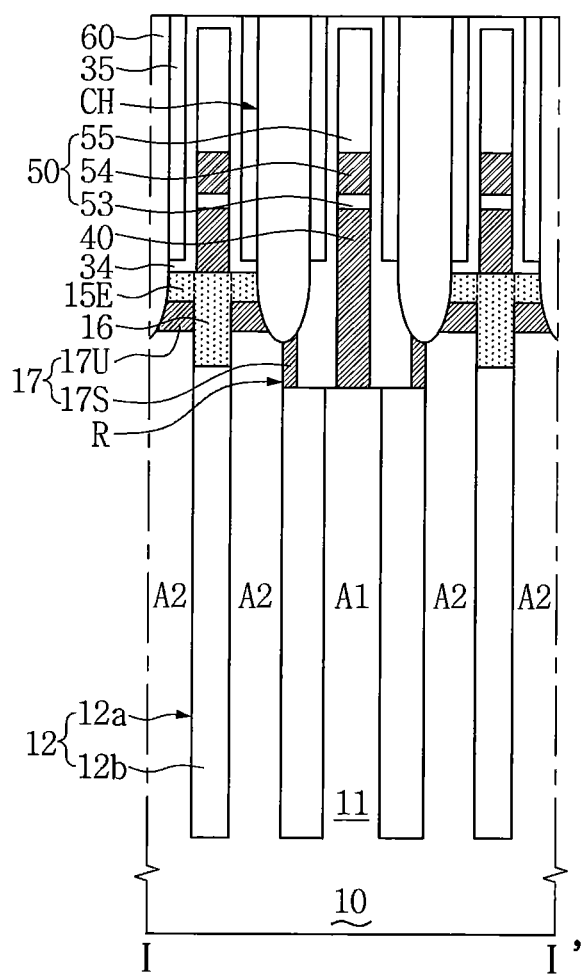

Referring to FIG. 53, the method may include forming a spacer layer 34 surrounding the bit-line structures 50 and the bit-line contact plugs 40, forming interlayer insulating layer 35 on the spacer layer 34, forming capacitor contact holes CH passing through the interlayer insulating layer 35 and the spacer layer 34, and forming capacitor contact plugs 60 in, and in some embodiments filling, the capacitor contact holes CH. At this time, as above described, because areas of the contact pads 17 are increased, an contacting area that is in contact with the capacitor contact plugs 60 may be increased, and thus the reliability of the semiconductor device may be improved.

Referring to FIG. 2E, the method may include forming capacitor structures 80 on the capacitor contact plugs 60 and the spacer layer 34.

Figure 54:
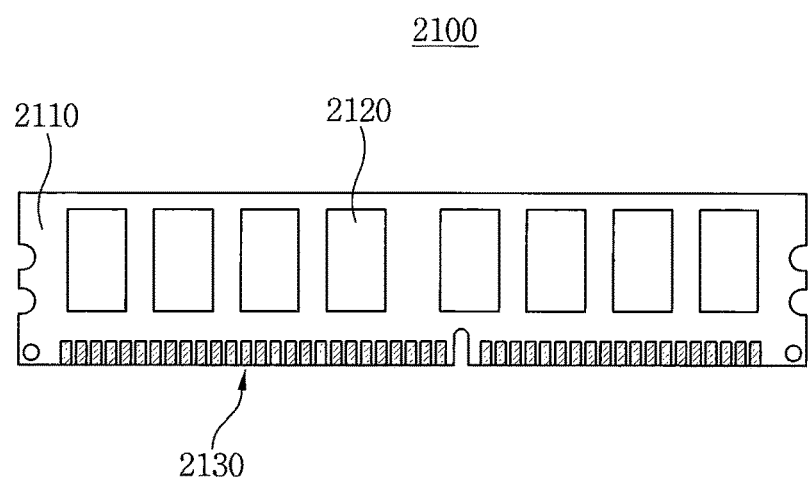
FIG. 54 is a diagram conceptually showing a memory module including at least one of the semiconductor devices in accordance with various embodiments of the inventive concepts.

FIG. 54 is a diagram conceptually showing a memory module 2100 including at least one of the semiconductor devices 100A to 100E in accordance with various embodiments of the inventive concepts. Referring to FIG. 54, the memory module 2100 in accordance with embodiments of the inventive concepts may include a module substrate 2110, a plurality of memory devices 2120 disposed on the module substrate 2110, and a plurality of terminals 2130 arranged on a side of the module substrate 2110. The module substrate 2110 may include a printed circuit board (PCB). The memory devices 2120 may include one or more of the semiconductor devices 100A to 100E in accordance with various embodiments of the inventive concepts. The plurality of terminals 2130 may include a metal such as copper. Each of the terminals 2130 may be electrically connected to each of the memory devices 2120. Since the memory module 2100 includes memory devices 2120 that can have a low leakage current and superior carrier mobility, device performance may be improved.

Figure 55:
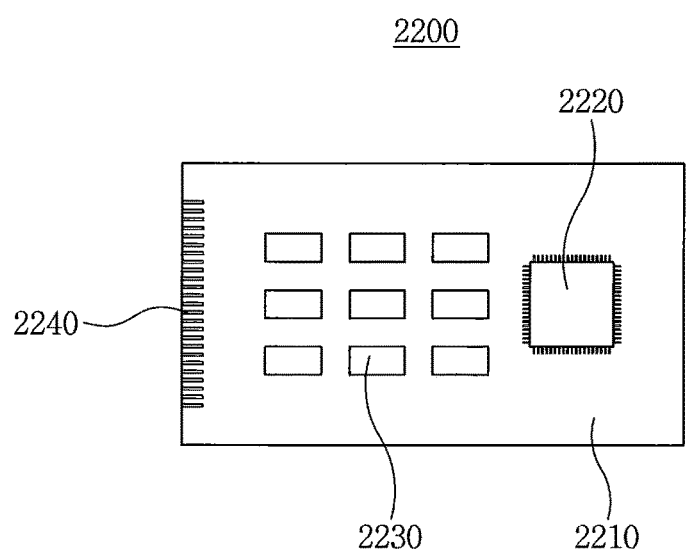
FIG. 55 is a diagram conceptually showing a semiconductor module in accordance with embodiments of the inventive concepts.

FIG. 55 is a diagram conceptually showing a semiconductor module 2200 in accordance with embodiments of the inventive concepts. Referring to FIG. 55, the semiconductor module 2200 in accordance with embodiments of the inventive concepts may include a processor 2220 on a module substrate 2210, and semiconductor devices 2230. The processor 2220 and/or the semiconductor devices 2230 may include at least one of the semiconductor devices 100A to 100E in accordance with various embodiments of the inventive concepts. Conductive input/output terminals 2240 may be disposed on at least one side of the module substrate 2210.

Figure 56:
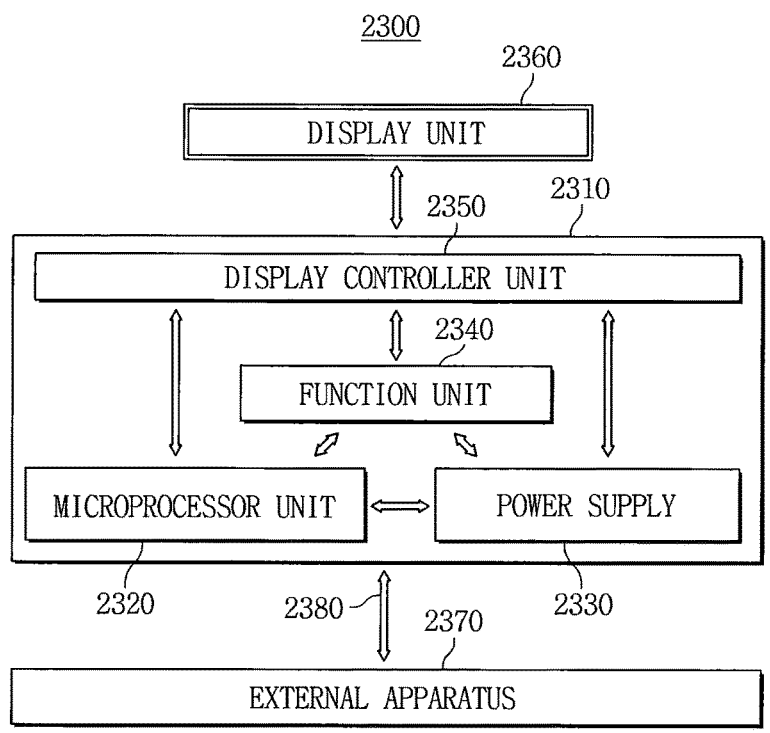
FIGS. 56 and 57 are block diagrams conceptually showing electronic systems in accordance with embodiments of the inventive concepts.

FIG. 56 is a block diagram conceptually showing an electronic system 2300 in accordance with embodiments of the inventive concepts. Referring to FIG. 56, the electronic system 2300 in accordance with embodiments of the inventive concepts may include a body 2310, a display unit 2360, and an external apparatus 2370. The body 2310 may include a microprocessor unit 2320, a power supply 2330, a function unit 2340, and/or a display controller unit 2350. The body 2310 may be a system board or motherboard including a PCB and/or a case. The microprocessor unit 2320, the power supply 2330, the function unit 2340, and/or the display controller unit 2350 may be mounted or arranged on a top surface or an inside of the body 2310. The display unit 2360 may be disposed on the top surface of the body 2310 or an inside/outside of the body 2310. The display unit 2360 may display an image processed by the display controller unit 2350. For example, the display unit 2360 may include a liquid crystal display (LCD), an active matrix organic light emitting diode (AMOLED) and/or various display panels.

The display unit 2360 may include a touch screen. Accordingly, the display unit 2360 may include an input/output function. The power supply 2330 may supply a current or voltage to the microprocessor unit 2320, the function unit 2340, the display controller unit 2350, etc. The power supply 2330 may include a rechargeable battery, a socket for a dry cell and/or a voltage/current converter. The microprocessor unit 2320 may receive a voltage from the power supply 2330 to control the function unit 2340 and the display unit 2360. For example, the microprocessor unit 2320 may include a CPU and/or an application processor (AP). The function unit 2340 may include a touch-pad, a touch-screen, a volatile/nonvolatile memory, a memory card controller, a camera, a lighting, an audio and video playback processor, a wireless transmission/reception antenna, a speaker, a microphone, a USB port, and/or other units having various functions. The microprocessor unit 2320, the function unit 2340 and/or any of the other blocks of FIG. 56 may include at least one of the semiconductor devices 100A to 100E in accordance with various embodiments of the inventive concepts.

Figure 57:
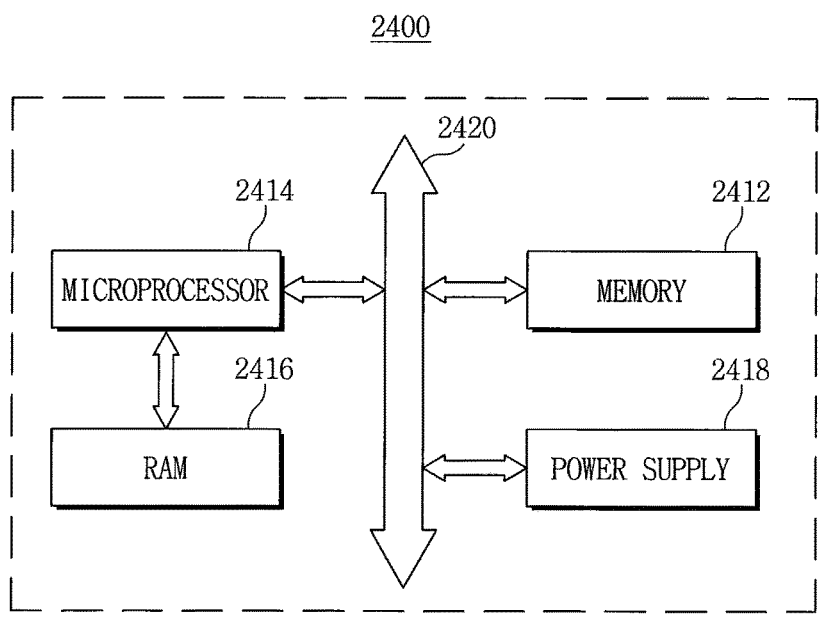

Referring to FIG. 57, an electronic system 2400 in accordance with embodiments of the inventive concepts may include a microprocessor 2414, a memory 2412, and a user interface 2418 which performs data communication through a bus 2420. The microprocessor 2414 may include a CPU and/or an AP. The electronic system 2400 may further include a random access memory (RAM) 2416 in direct communication with the microprocessor 2414. The microprocessor 2414 and/or the RAM 2416 may be assembled in a single package. The user interface 2418 may be used to input or output data to or from the electronic system 2400. For example, the user interface 2418 may include a touch-pad, a touch-screen, a keyboard, a mouse, a scanner, a voice detector, a cathode ray tube (CRT) monitor, an LCD, an AMOLED, a plasma display panel (PDP), a printer, lighting and/or various other input/output devices. The memory 2412 may store codes for operating the microprocessor 2414, data processed by the microprocessor 2414 and/or external input data. The memory 2412 may include a memory controller, a hard disk and/or a solid state drive (SSD). The microprocessor 2414, the RAM 2416, the memory 2412 and/or any of the other blocks of FIG. 57 may include at least one of the semiconductor devices 100A to 100E in accordance with various embodiments of the inventive concepts.

In semiconductor devices in accordance with various embodiments of the inventive concepts, a recess region that is exposed at a center portion of active regions may be expanded to both end portions of the adjacent active regions. Accordingly, when an etching process for forming a bit-line is performed, conductive residue may be reduced or prevented from remaining in the recess region.

Also, a short margin between a bit-line contact and a capacitor contact may be improved by reducing or preventing the conductive residue from being generated in the recess region.

Other various effects have been described in the above detailed description.

Although a few embodiments have been described, those skilled in the art will readily appreciate that many modifications are possible without materially departing from the teachings and advantages described herein. Accordingly, all such modifications are intended to be included within the scope of the inventive concepts as defined in the claims.

What is claimed is:
1. A semiconductor device, comprising:
a substrate;
a first device isolation region and a second device isolation region defining a first active region, a second active region, and a third active region in the substrate, wherein the first active region is located between the second and third active regions, the first device isolation region is located between the first and second active regions, and the second device isolation region is located between the first and third active regions;
a recess region in the substrate on an upper surface of the first active region, upper surfaces of the first and second device isolation regions and upper sidewalls of the second and third active regions in the recess region;
active buffer patterns on the second and third active regions; and
wherein the recess region includes a flat floor that extends across the upper surface of the first active region and also extends across the upper surfaces of the first and second device isolation regions
such that the upper surface of the first active region and the upper surfaces of the first and second device isolation regions are coplanar.
2. The semiconductor device of claim 1, further comprising:
a third device isolation region and a fourth device isolation region in the substrate,
wherein the second active region is located between the first and third device isolation regions, and the third active region is located between the second and fourth device isolation regions.
3. The semiconductor device of claim 2, wherein an upper surface of the second active region is higher than the upper surface of the first device isolation region and lower than an upper surface of the third device isolation region, and
wherein an upper surface of the third active region is higher than the upper surface of the second device isolation region and lower than an upper surface of the fourth device isolation region.
4. The semiconductor device of claim 1, wherein the active buffer patterns are formed on only the second and third active regions.
5. The semiconductor device of claim 2, wherein the active buffer patterns comprise:
lower active buffer patterns on the second and third active regions; and
upper active buffer patterns on the lower active buffer patterns that are on the second and third active regions, and on the third and fourth device isolation regions.
6. The semiconductor device of claim 5, wherein upper surfaces of the lower active buffer patterns and upper surfaces of the third and fourth device isolation regions are coplanar.
7. The semiconductor device of claim 2, wherein an upper surface of the second active region is higher than the upper surface of the first device isolation region and coplanar with an upper surface of the third device isolation region, and
wherein an upper surface of the third active region is higher than the upper surface of the second device isolation region and coplanar with an upper surface of the fourth device isolation region.
8. The semiconductor device of claim 7, wherein the active buffer patterns on the second the third active regions extend onto the third and fourth device isolation regions, respectively.
9. The semiconductor device of claim 2, wherein an upper surface of the second active region is higher than upper surfaces of the first and third device isolation regions, and an upper surface of the third active region is higher than upper surfaces of the second and fourth device isolation regions.

10. The semiconductor device of claim 9, further comprising:
   contact pads between the second and third active regions and the active buffer patterns; and
   device isolation buffer patterns on the respective third and fourth device isolation regions.

11. The semiconductor device of claim 10, wherein upper surfaces of the active buffer patterns and upper surfaces of the device isolation buffer patterns are coplanar.

12. The semiconductor device of claim 10, wherein the contact pads include upper contact pads on the upper surfaces of the second and third active regions, and side contact pads on the upper sidewalls of the second and third active regions exposed in the recess region.

13. A semiconductor device, comprising: a substrate;
   a first device isolation region, a second device isolation region, a third device isolation region, and a fourth device isolation region defining a first active region, a second active region, a third active region, a fourth active region, and a fifth active region in the substrate, wherein the first active region is located between the second and third active regions, the second active region is located between the first and fourth active regions, the third active region is located between the first and fifth active regions, the first device isolation region is located between the first and second active regions, the second device isolation region is located between the first and third active regions, the third device isolation region is located between the second and fourth active regions, and the fourth device isolation region is located between the third and fifth active regions;
   a recess region in the substrate on an upper surface of the first active region, upper surfaces of the first and second device isolation regions and upper sidewalls of the second and third active regions in the recess region; and
   active buffer patterns on the second to fifth active regions; and
   wherein the recess region includes a flat floor that extends across the upper surface of the first active region and also extends across the upper surfaces of the first and second device isolation regions such that the upper surface of the first active region and the upper surfaces of the first and second device isolation regions are coplanar.

14. The semiconductor device of claim 13, wherein the active buffer patterns extend onto the third and fourth device isolation regions.

15. A semiconductor device, comprising: device isolation regions defining a plurality of adjacent active regions in a substrate, wherein each of the active regions has a first contact area at a center portion and a second contact area and a third contact area at both end portions;
   a recess region on upper surfaces of the first contact areas of the active regions, upper surfaces of the device isolation regions located at both sides of the first contact areas and upper sidewalls of the second and third contact areas in the recess region;
   buffer patterns on the second and third contact areas of the active regions: and
   wherein the recess region includes a flat floor that extends across the upper surfaces of the first contact areas of the active regions and also extends across the upper surfaces of the device isolation regions located at both sides of the first contact areas such that the upper surfaces of the first contact areas of the active regions and the upper surfaces of the device isolation regions located at both sides of the first contact areas are coplanar.

16. The semiconductor device of claim 15, further comprising:
   bit line contact plugs on the first contact areas; and
   bit line structures on the bit line contact plugs.

17. The semiconductor device of claim 16, further comprising:
   a spacer layer surrounding the bit line contact plugs and the bit line structures and filling the recess region; and
   an interlayer insulating layer surrounding side surfaces of the spacer layer.

* * * * *